US011063040B2

(12) United States Patent
Clarke et al.

(10) Patent No.: US 11,063,040 B2
(45) Date of Patent: Jul. 13, 2021

(54) QUANTUM DOT DEVICES

(71) Applicant: Intel Corporation, Santa Clara, CA (US)

(72) Inventors: James S. Clarke, Portland, OR (US); Nicole K. Thomas, Portland, OR (US); Zachary R. Yoscovits, Beaverton, OR (US); Hubert C. George, Portland, OR (US); Jeanette M. Roberts, North Plains, OR (US); Ravi Pillarisetty, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/340,512

(22) PCT Filed: Dec. 24, 2016

(86) PCT No.: PCT/US2016/068603
§ 371 (c)(1),
(2) Date: Apr. 9, 2019

(87) PCT Pub. No.: WO2018/084878
PCT Pub. Date: May 11, 2018

(65) Prior Publication Data
US 2019/0252377 A1    Aug. 15, 2019

Related U.S. Application Data

(60) Provisional application No. 62/417,047, filed on Nov. 3, 2016.

(51) Int. Cl.
*H01L 27/088*    (2006.01)
*G06N 10/00*    (2019.01)
(Continued)

(52) U.S. Cl.
CPC ........... *H01L 27/088* (2013.01); *G06N 10/00* (2019.01); *H01L 21/823456* (2013.01);
(Continued)

(58) Field of Classification Search
CPC ........... H01L 27/088; H01L 21/823456; H01L 27/18; H01L 29/66977; H01L 29/778;
(Continued)

(56) References Cited

U.S. PATENT DOCUMENTS 7,135,720 B2 * 11/2006 Nagy .................. H01L 29/7787
257/192
7,830,695 B1    11/2010 Moon
(Continued)

FOREIGN PATENT DOCUMENTS

WO    2015184484 A1    12/2015
WO    2017155531 A1    9/2017
(Continued)

OTHER PUBLICATIONS

PCT International Search Report and Written Opinion for PCT/US2016/068603 dated Jul. 18, 2017; 14 pages.
(Continued)

*Primary Examiner* — Shahed Ahmed
(74) *Attorney, Agent, or Firm* — Patent Capital Group

(57) ABSTRACT

Quantum dot devices, and related systems and methods, are disclosed herein. In some embodiments, a quantum dot device may include a quantum well stack; a plurality of first gates above the quantum well stack; and a plurality of second gates above the quantum well stack; wherein the plurality of first gates are arranged in electrically continuous rows extending in a first direction, and the plurality of second gates are arranged in electrically continuous rows extending in a second direction perpendicular to the first direction.

22 Claims, 31 Drawing Sheets

(51) Int. Cl.
*H01L 21/8234* (2006.01)
*H01L 27/18* (2006.01)
*H01L 29/66* (2006.01)
*H01L 29/778* (2006.01)
*B82Y 10/00* (2011.01)

(52) U.S. Cl.
CPC ........ *H01L 27/18* (2013.01); *H01L 29/66977* (2013.01); *H01L 29/778* (2013.01); *B82Y 10/00* (2013.01)

(58) Field of Classification Search
CPC ........... H01L 29/4238; H01L 29/66439; H01L 29/0692; G06N 10/00; G06N 99/002; B82Y 10/00; Y10S 977/933; H03K 19/195–1958
See application file for complete search history.

(56) References Cited

U.S. PATENT DOCUMENTS

| | | | |
|---|---|---|---|
| 2002/0179897 A1 | 12/2002 | Eriksson et al. | |
| 2007/0174227 A1 | 7/2007 | Johnson et al. | |
| 2010/0151666 A1* | 6/2010 | Kouvetakis | H01L 21/02636 438/488 |
| 2011/0006280 A1 | 1/2011 | Bidal et al. | |
| 2011/0085381 A1 | 4/2011 | Ferrus | |
| 2013/0264617 A1 | 10/2013 | Joshi et al. | |
| 2016/0020317 A1* | 1/2016 | Rachmady | H01L 29/775 257/24 |
| 2016/0149051 A1 | 5/2016 | Zhang | |
| 2016/0218181 A1* | 7/2016 | Yang | H01L 21/02488 |
| 2017/0294456 A1* | 10/2017 | Lee | H01L 21/02595 |
| 2018/0102470 A1* | 4/2018 | Das | H01L 23/5384 |
| 2019/0130298 A1* | 5/2019 | Pioro-Ladriere | G06N 10/00 |
| 2019/0131511 A1 | 5/2019 | Clarke et al. | |
| 2019/0140073 A1 | 5/2019 | Pillarisetty et al. | |
| 2019/0148530 A1 | 5/2019 | Pillarisetty et al. | |
| 2019/0157393 A1 | 5/2019 | Roberts et al. | |
| 2019/0164077 A1 | 5/2019 | Roberts et al. | |
| 2019/0164959 A1 | 5/2019 | Thomas et al. | |
| 2019/0165152 A1 | 5/2019 | Roberts et al. | |
| 2019/0181256 A1 | 6/2019 | Roberts et al. | |
| 2019/0194016 A1 | 6/2019 | Roberts et al. | |
| 2019/0198618 A1 | 6/2019 | George et al. | |
| 2019/0206991 A1 | 7/2019 | Pillarisetty et al. | |
| 2019/0206992 A1 | 7/2019 | George et al. | |
| 2019/0206993 A1 | 7/2019 | Pillarisetty et al. | |
| 2019/0214385 A1 | 7/2019 | Roberts et al. | |
| 2019/0221659 A1 | 7/2019 | George et al. | |
| 2019/0229188 A1 | 7/2019 | Clarke et al. | |
| 2019/0229189 A1 | 7/2019 | Clarke et al. | |
| 2019/0259850 A1 | 8/2019 | Pillarisetty et al. | |
| 2019/0266511 A1 | 8/2019 | Pillarisetty et al. | |
| 2019/0267692 A1 | 8/2019 | Roberts et al. | |
| 2019/0288176 A1 | 9/2019 | Yoscovits et al. | |
| 2019/0296214 A1 | 9/2019 | Yoscovits et al. | |
| 2019/0305037 A1 | 10/2019 | Michalak et al. | |
| 2019/0305038 A1 | 10/2019 | Michalak et al. | |
| 2019/0312128 A1 | 10/2019 | Roberts et al. | |
| 2019/0341459 A1 | 11/2019 | Pillarisetty et al. | |
| 2019/0363181 A1 | 11/2019 | Pillarisetty et al. | |
| 2019/0363239 A1 | 11/2019 | Yoscovits et al. | |

FOREIGN PATENT DOCUMENTS

| | | |
|---|---|---|
| WO | 2017213638 A1 | 12/2017 |
| WO | 2017213639 A1 | 12/2017 |
| WO | 2017213641 A1 | 12/2017 |
| WO | 2017213645 A1 | 12/2017 |
| WO | 2017213646 A1 | 12/2017 |
| WO | 2017213647 A1 | 12/2017 |
| WO | 2017213648 A1 | 12/2017 |
| WO | 2017213649 A1 | 12/2017 |
| WO | 2017213651 A1 | 12/2017 |
| WO | 2017213661 A1 | 12/2017 |
| WO | 2017217958 A1 | 12/2017 |
| WO | 2018030977 A1 | 2/2018 |
| WO | 2018044267 A1 | 3/2018 |
| WO | 2018057013 A1 | 3/2018 |
| WO | 2018057015 A1 | 3/2018 |
| WO | 2018057018 A1 | 3/2018 |
| WO | 2018057023 A1 | 3/2018 |
| WO | 2018057024 A1 | 3/2018 |
| WO | 2018057027 A1 | 3/2018 |
| WO | 2018063139 A1 | 4/2018 |
| WO | 2018063168 A1 | 4/2018 |
| WO | 2018063170 A1 | 4/2018 |
| WO | 2018063202 A1 | 4/2018 |
| WO | 2018063203 A1 | 4/2018 |
| WO | 2018063205 A1 | 4/2018 |
| WO | 2018084878 A1 | 5/2018 |

OTHER PUBLICATIONS

European Extended Search Report issued in EP Application No. 16920854.3 dated May 18, 2020; 11 pages.
Lyanda-Geller, Y.B., et. al., "Scalable Quantum Computing With Enhancement Quantum Dots," Aug. 17, 2005 (38 pages).
"A Nanodamascene Process for Advanced Single-Electron Transistor Fabrication," Dubuc et al, IEEE Transactions on Nanotechnology, vol. 7, No. 1, Jan. 2008, pp. 68-73.
"A two-qubit logic gate in silicon," Veldhorst et al., Nature, vol. 526, Oct. 15, 2015, pp. 410-414.
"Gate-Defined Quantum Dots in Intrinsic Silicon," Angus et al., Nano Letters 2007, vol. 7, No. 7, 2051-2055, publication date Jun. 14, 2007, retrieved from http://pubs.acs.org on Mar. 31, 2009, 6 pages.
"Independent, extensible control of same-frequency superconducting qubits by selective broadcasting," Asaad et al., Netherlands Organisation for Applied Scientific Research, Aug. 28, 2015, 17 pages.
"Fast sensing of double-dot charge arrangement and spin state with an rf sensor quantum dot," Barthel et al, Materials Department, University of California, Santa Barbara, Jan. 16, 2014, 4 pages.
"Undoped accumulation-mode Si/SiGe quantum dots," Borselli et al, HRL Laboratories, LLC., Jul. 15, 2014, 4 pages.
"Multilayer microwave integrated quantum circuits for scalable quantum computing," Brecht et al, Department of Applied Physics, Yale University, Sep. 4, 2015, 5 pages.
"Reducing intrinsic loss in superconducting resonators by surface treatment and deep etching of silicon substrates," Bruno, et al., QuTech Advanced Research Center and Kavli Institute of Nanoscience, Delft University of Technology, The Netherlands, Feb. 16, 2015, 9 pages.
"Spin Relaxation and Decoherence of Holes in Quantum Dots," Bulaev et al., Phys. Rev. Lett. 95, 076805, Aug. 11, 2005, 1 page.
"Fundamentals of Silicon Material Properties for Successful Exploitation of Strain Engineering in Modern CMOS Manufacturing," Chidambaram et al, IEE Transactions on Electron Devices, vol. 53, No. 5, May 2006, pp. 944-964.
"Ultrafast optical control of individual quantum dot spin qubits," De Greve et al, Reports on Progress in Physics, vol. 76, No. 9, Sep. 4, 2013, 2 pages.
"Fabrication and Characterization of Sidewall Defined Silicon-on-Insulator Single-Electron Transistor," Jung et al., IEEE Transactions on Nanotechnology, vol. 7, No. 5, Sep. 2008, pp. 544-550.
"How it's built: Micron/Intel3D NAND Micron Opens the Veil a Little," Moyer, Bryon, retrieved from https://www.eejournal.com/article/20160201-micron/ on Nov. 29, 2017, 9 pages.
"Investigation of Vertical Type Single-Electron Transistor with Sidewall Spacer Quantum Dot," Kim et al, Student Paper, Inter-University Semiconductor Research Center and School of Electrical Engineering and Computer Science, Seoul National University, ISDRS 2011, Dec. 7-9, 2011, ISDRS 2011—http://www.ece.umd.edu/ISDR2011, 2 pages.
"Platinum single-electron transistors with tunnel barriers made by atomic layer deposition", George et al., Department of Electrical Engineering, University of Notre Dame, Received Jul. 7, 2010:Published Nov. 5, 2010, 3 pages.

(56) References Cited

OTHER PUBLICATIONS

"Surface loss simulations of superconducting coplanar waveguide resonators," Wenner et al, Applied Physics Letters 99, 113513 (2011), pp. 113513-1 through 3.
"Quantum computation with quantum dots," Loss et al , Physical Review A, vol. 57, No. 1, Jan. 1998, pp. 120-126.
"Ultafast high-fidelity initialization of a quantum-dot spin qubit without magnetic fields," Mar et al., Phys. Rev. B 90 241303®, published Dec. 15, 2014, 1 page.
"Delaying Forever: Uniaxial Strained Silicon Transistors in a 90nm CMOS Technology," Mistry et al Portland Technology Department, TCAD, Intel Corp., 2 pages.
Supplementary Information, retrieved from www.nature.com, doi:10.1038/nature 15263, 8 pages.
"Magnetic field tuning of coplanar waveguide resonators," Healey, et al., Applied Physics Letters 93, 043513 (2008), pp. 043513-1 through 3 (4 pages with cover sheet).
"Embracing the quantum limit in silicon computing," Morton et al, Macmillan Publishers, Nov. 17, 2011, vol. 479, Nature, pp. 345-353.
"Review : Towards Spintronic Quantum Technologies with Dopants in Silicon," Morley, Gavin, Department of Physics, University of Warwich, 13 pages.
"A Reconfigurable Gate Architecture for Si/SiGe Quantum Dots," Zajac et al., Department of Physics, Princeton University; Department of Physics, University of California; Feb. 6, 2015, 5 pages.
"Scalable quantum circuit and control for a superconducting surface code," Versluis et al, Netherlands Organisation for Applied Scientific Research, Dec. 28, 2016, 9 pages.
"Defect reduction of selective Ge epitaxy in trenches on Si(001) substrates using aspect ratio trapping," Park et al., Applied Physics Letter 90, 052113 (2007), pp. 052113-1 through 3.
"Photon- and phonon-assisted tunneling in the three-dimensional charge stability diagram of a triple quantum dot array," Braakman et al., Applied Physics Letters 102, 112110 (2013), pp. 112110-1 through 4 (5 pages with cover sheet).
"Radio frequency measurements of tunnel couplings and singlet-triplet spin states in Si:P quantum dots," House et al., Nature Communications, 6:884, DOI: 10.1038/ncomms9848, pp. 1-6.
"Detecting bit-flip errors in a logical qubit using stabilizer measurements," Riste et al., Nature Communications, 6:6983, DOI: 10.1038/ncomms7983, pp. 1-6.
"Scalable gate architecture for densely packed semiconductor spin qubits," Zajac et al, Department of Physics, Princeton University; Sandia National Laboratories, 8 pages.
"Silicon CMOS architecture for a spin-based quantum computer," Veldhorst et al., Qutech, TU Delft, The Netherlands, Centre for Quantum Computation and Communication Technology, School of Electrical Engineering and Telecommunications, The University of New South Wales, NanoElectronics Group, MESA +Institute for Nanotechnology, University of Twente, The Netherlands, Oct. 2, 2016, 13 pages.
"Single-electron Transistors fabricated with sidewall spacer patterning," Park et al., Superlattices and Microstructures 34 (2003) 231-239.
"Single-electron Transistors with wide operating temperature range," Dubuc et al., Applied Physics Letters 90, 113104 (2007) pp. 113104-1 through 3.
"Single-shot read-out of an individual electron spin in a quantum dot," Elzerman et al., Nature, vol. 430, Jul. 22, 2004, pp. 431-435.
"Suspending superconducting qubits by silicon micromachining," Chu et al., Department of Applied Physics, Yale University, Jun. 10, 2016, 10 pages.
"Single-charge tunneling in ambipolar silicon quantum dots," Müller, Filipp, Dissertation, University of Twente, Jun. 19, 2015, 148 pages.
"An addressable quantum dot qubit with fault-tolerant control-fidelity," Veldhorst et al., Nature Nanotechnology vol. 9, Dec. 2014, pp. 981-985.

\* cited by examiner

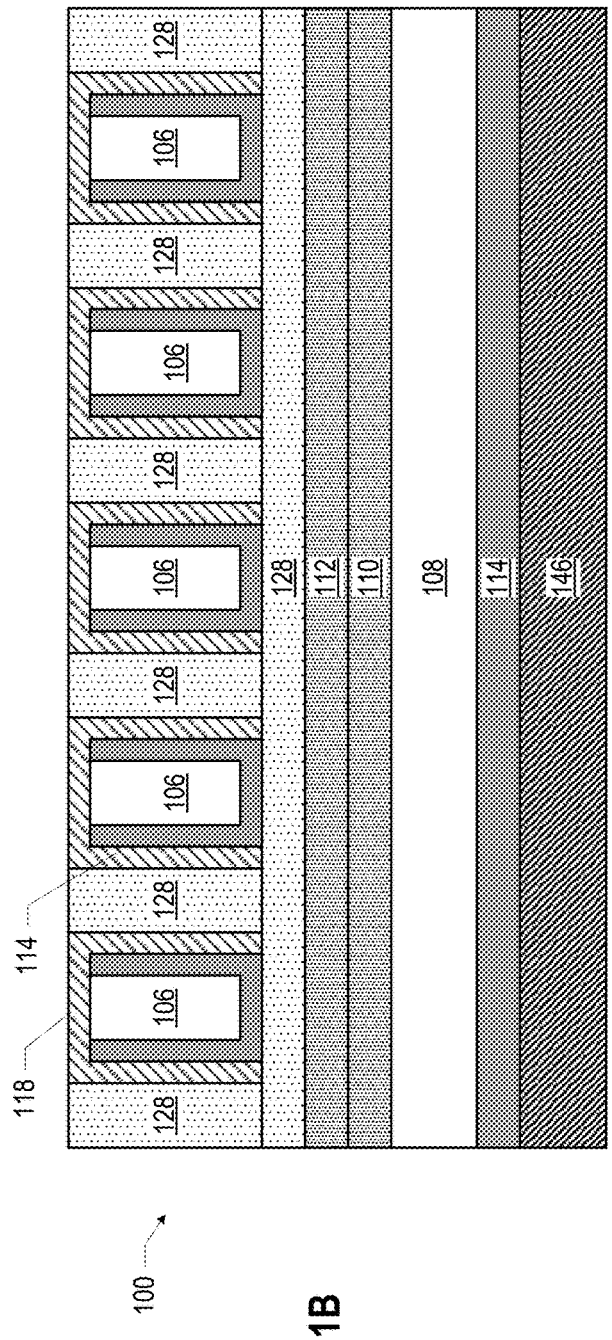
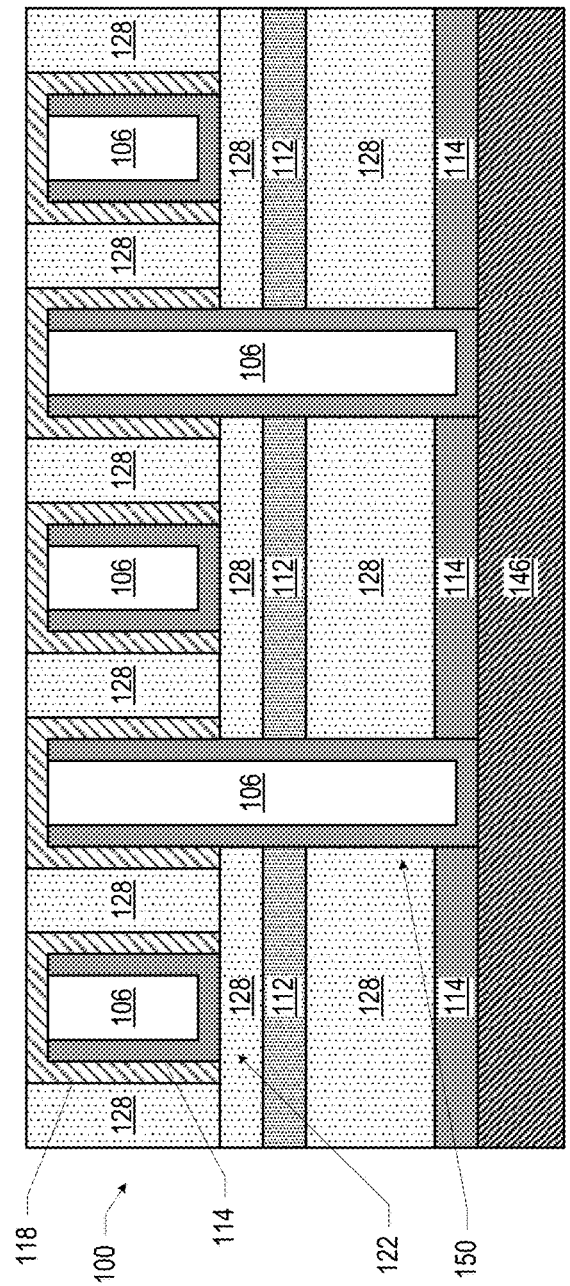

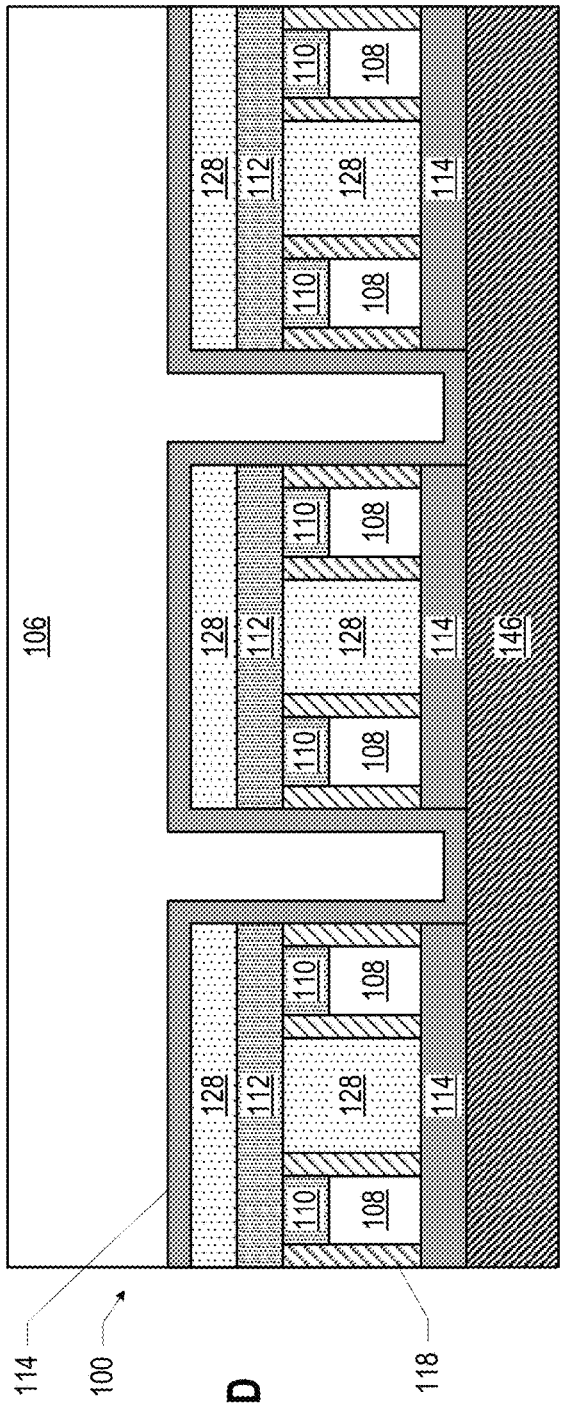
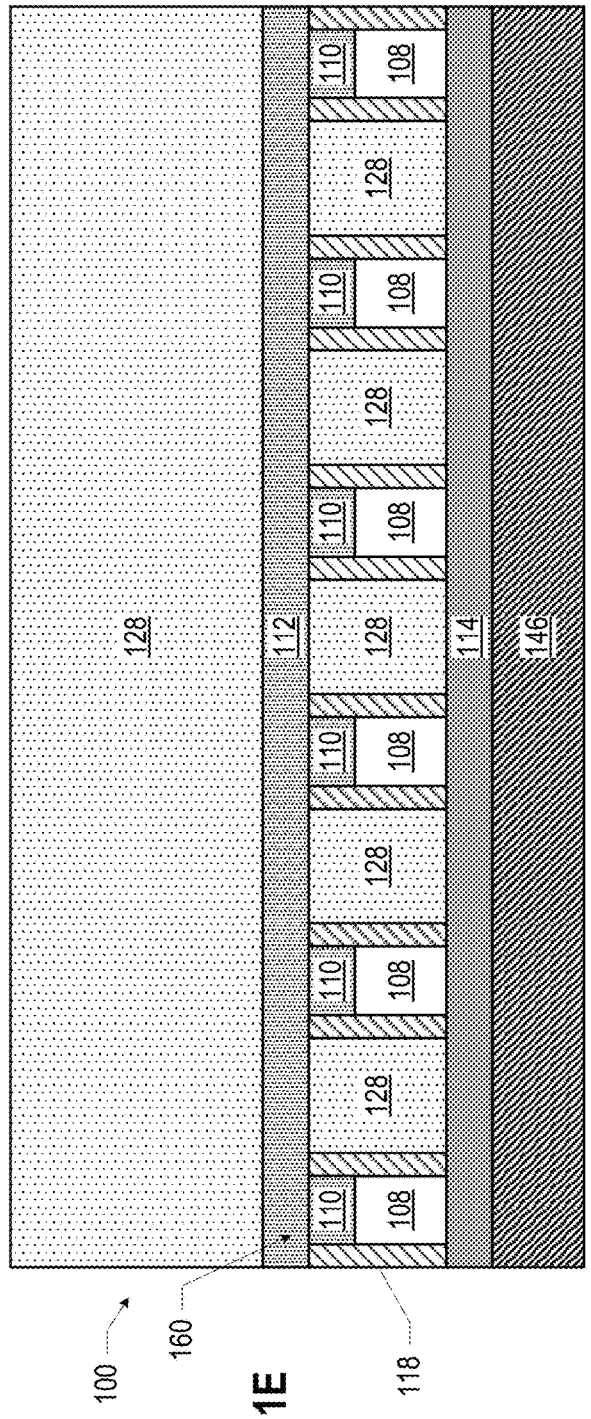
FIG. 1D
FIG. 1E

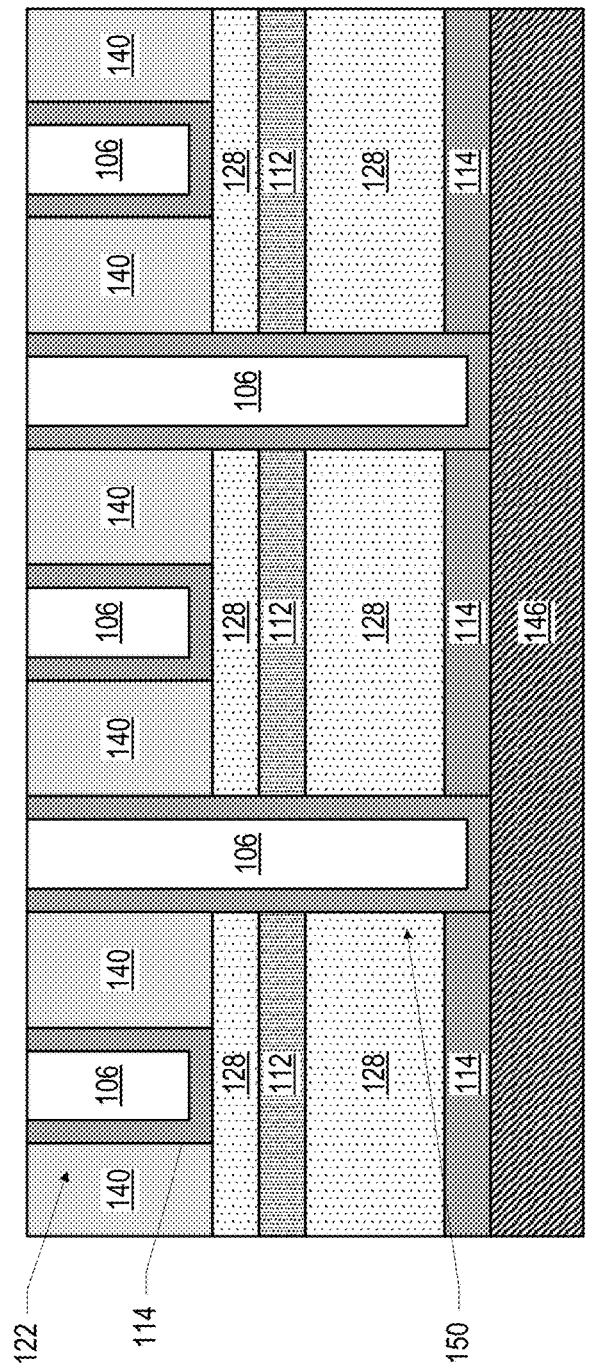
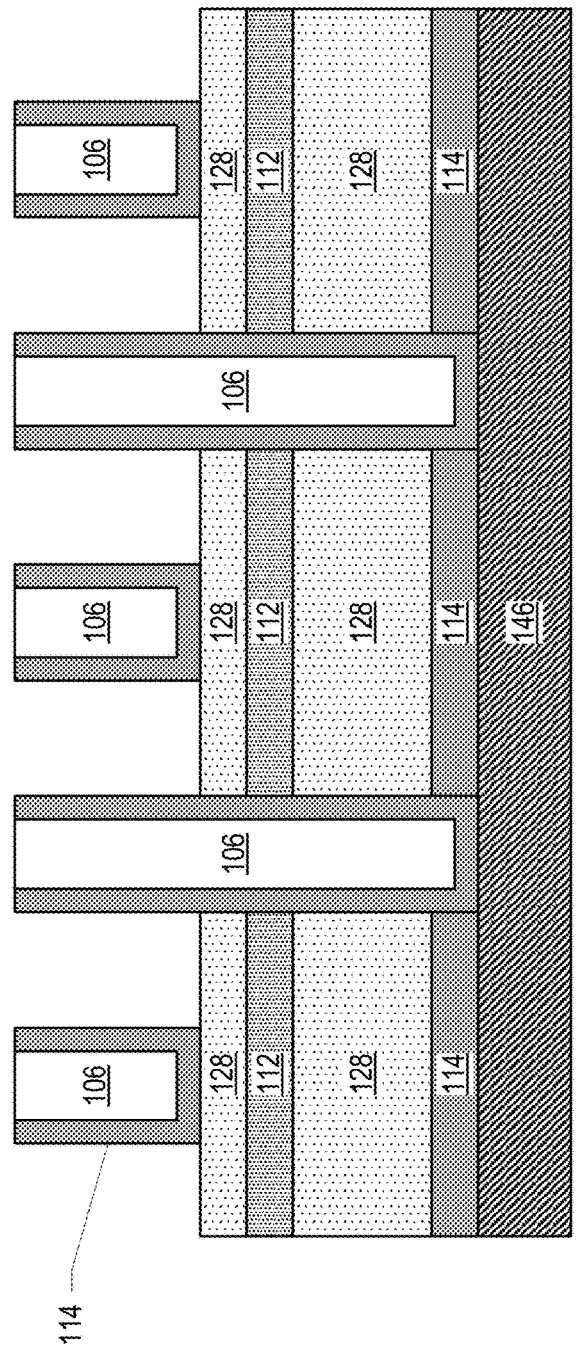
FIG. 2R
FIG. 2S

FIG. 12A

| 152-1 |
|---|
| 154 |
| 152-2 |

| 154-1 |
|---|
| 152-1 |
| 154-2 |
| 152-2 |
| 154-3 |

| 155-1 |
|---|
| 152-1 |
| 154-1 |
| 137 |
| 154-2 |
| 152-2 |
| 155-2 |
| 176 |

| 155-1 |
|---|
| 152-1 |
| 154-1 |
| 137-1 |
| 155-3 |
| 137-2 |
| 154-2 |
| 152-2 |
| 155-2 |
| 176 |

| 155-1 |
|---|
| 137-1 |
| 154-1 |
| 152-1 |
| 155-3 |
| 152-2 |
| 154-2 |
| 137-2 |
| 155-2 |
| 176 |

146 →

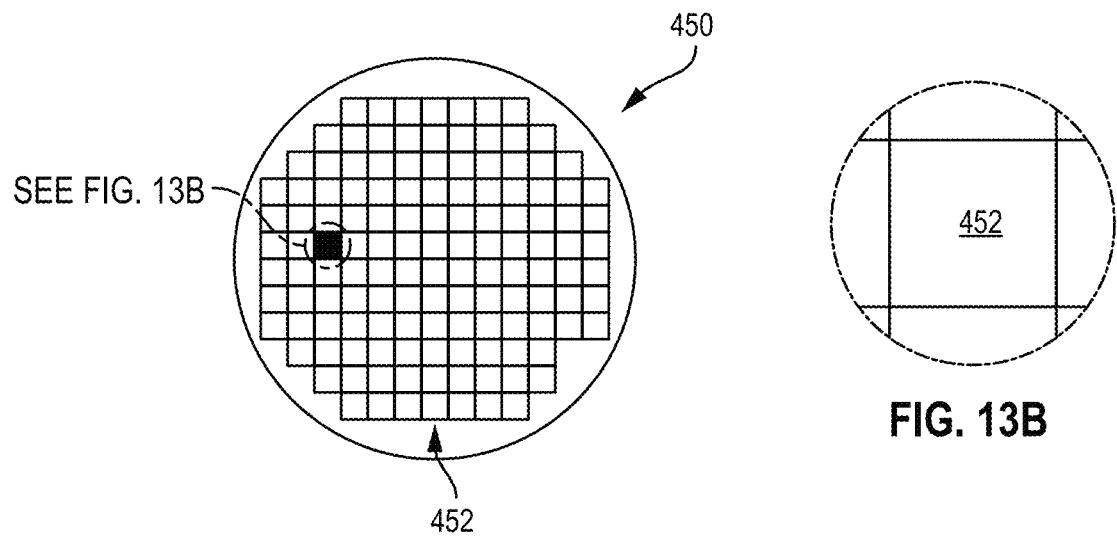
FIG. 13A
FIG. 13B
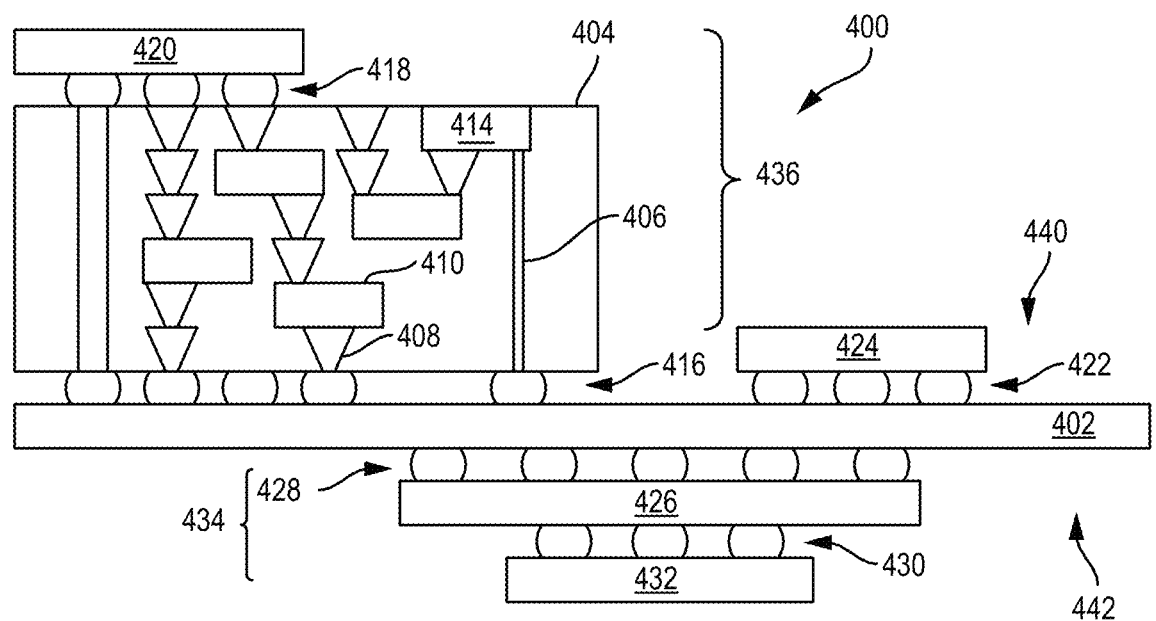
FIG. 14

QUANTUM DOT DEVICES

CROSS-REFERENCE TO RELATED APPLICATION

This application claims priority to U.S. Provisional Application No. 62/417,047, titled "QUANTUM DOT DEVICES" and filed Nov. 3, 2016, and is a national stage application under 35 U.S.C. § 371 of PCT International Application Serial No. PCT/US2016/068603, filed Dec. 24, 2016, titled "QUANTUM DOT DEVICES." The disclosure of each prior application is considered part of (and is incorporated by reference in) the disclosure of this application.

BACKGROUND

Quantum computing refers to the field of research related to computation systems that use quantum mechanical phenomena to manipulate data. These quantum mechanical phenomena, such as superposition (in which a quantum variable can simultaneously exist in multiple different states) and entanglement (in which multiple quantum variables have related states irrespective of the distance between them in space or time), do not have analogs in the world of classical computing, and thus cannot be implemented with classical computing devices.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 1A-1E are various views of a quantum dot device, in accordance with various embodiments.

FIGS. 12A-12E illustrate various embodiments of a quantum well stack that may be included in a quantum dot device, in accordance with various embodiments.

FIGS. 13A and 13B are top views of a wafer and dies that may include any of the quantum dot devices disclosed herein.

FIG. 14 is a cross-sectional side view of a device assembly that may include any of the quantum dot devices disclosed herein.

DETAILED DESCRIPTION

Figure 1A:
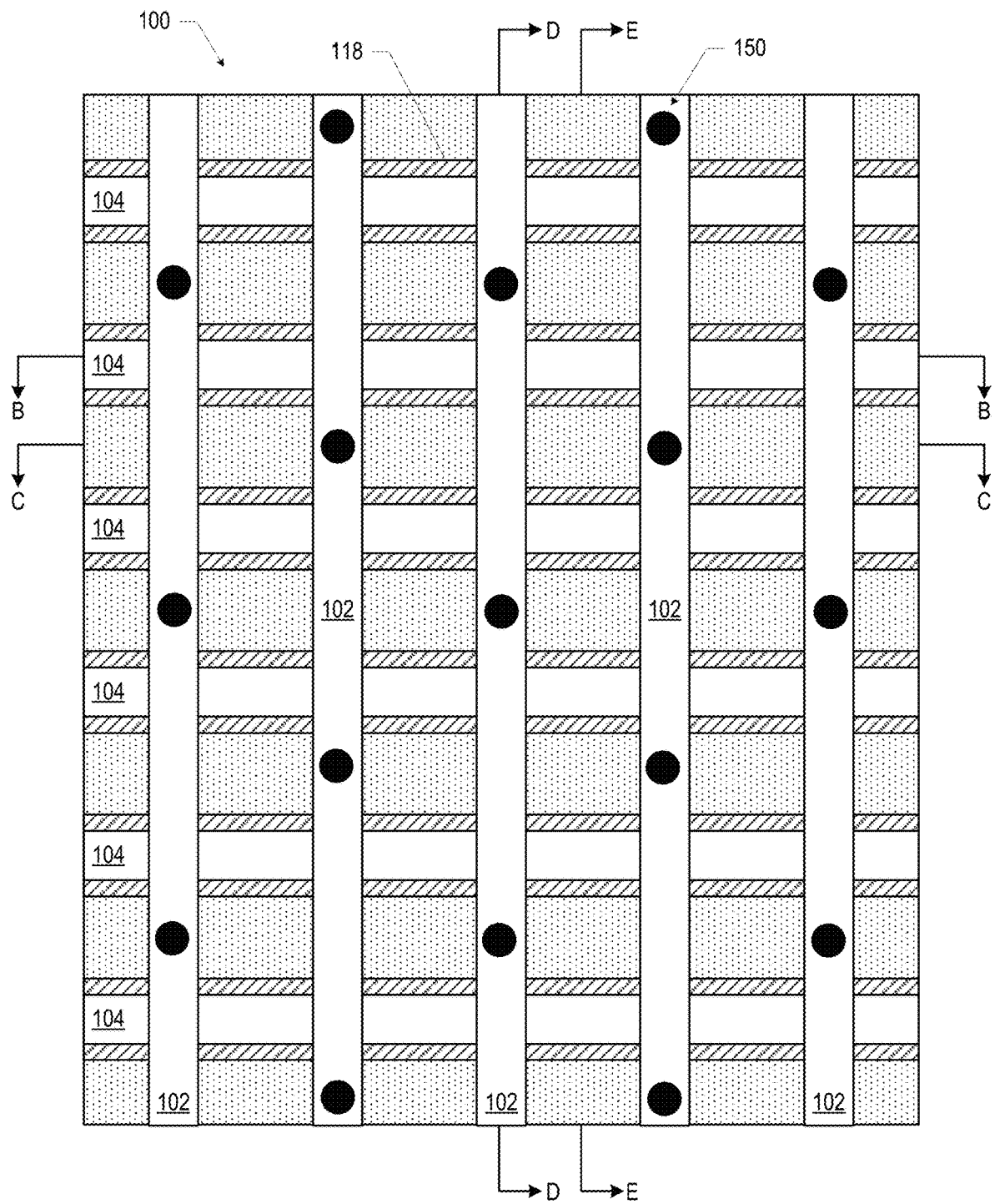

Quantum dot devices, and related systems and methods, are disclosed herein. In some embodiments, a quantum dot device may include a quantum well stack; a plurality of first gates above the quantum well stack; and a plurality of second gates above the quantum well stack; wherein a first gate is between each nearest neighbor pair of second gates. In some embodiments, a quantum dot device may include a quantum well stack; a plurality of first gates above the quantum well stack; and a plurality of second gates above the quantum well stack; wherein the plurality of first gates are arranged in electrically continuous rows extending in a first direction, and the plurality of second gates are arranged in electrically continuous rows extending in a second direction perpendicular to the first direction. In some embodiments, a quantum dot device may include a quantum well stack; a plurality of first gates above the quantum well stack; and a plurality of second gates above the quantum well stack; wherein the plurality of second gates are arranged as points in a grid, and diagonal subsets of the plurality of second gates with respect to the grid are electrically continuous.

The quantum dot devices disclosed herein may enable the formation of quantum dots to serve as quantum bits ("qubits") in a quantum computing device, as well as the control of these quantum dots to perform quantum logic operations. Unlike previous approaches to quantum dot formation and manipulation, various embodiments of the quantum dot devices disclosed herein provide strong spatial localization of the quantum dots (and therefore good control over quantum dot interactions and manipulation), good scalability in the number of quantum dots included in the device, and/or design flexibility in making electrical connections to the quantum dot devices to integrate the quantum dot devices in larger computing devices.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. As used herein, a "high-k dielectric" refers to a material having a higher dielectric constant than silicon oxide.

The disclosure may use the singular term "layer," but the term "layer" should be understood to refer to assemblies that may include multiple different material layers. The accompanying drawings are not necessarily drawn to scale. For ease of discussion, all of the lettered sub-figures associated with a particular numbered figure may be referred to by the number of that figure; for example, FIGS. 1A-1E may be referred to as "FIG. 1," FIGS. 2A-2C may be referred to as "FIG. 2," etc.

FIGS. 1A-1E are various views of a quantum dot device 100, in accordance with various embodiments. FIG. 1A is a top view of a portion of the quantum dot device 100 with some of the materials removed so that the quantum dot (QD) gate lines and barrier gate lines 104 are visible. Although many of the drawings and description herein may refer to a particular set of lines or gates as "barrier" or "quantum dot" lines or gates, respectively, this is simply for ease of discussion, and in other embodiments, the role of "barrier" and "quantum dot" lines and gates may be switched (e.g., barrier gates may instead act as quantum dot gates, and vice versa). FIGS. 1B-1E are side cross-sectional views of a quantum dot device 100; in particular, FIG. 1B is a view through the section B-B of FIG. 1A, FIG. 1C is a view through the section C-C of FIG. 1A, FIG. 1D is a view through the section D-D of FIG. 1A, and FIG. 1E is a view through the section E-E of FIG. 1A.

As used herein, during operation of the quantum dot device 100, electrical signals (e.g., voltages, radio frequency (RF), and/or microwave signals) may be provided to a quantum dot gate (and neighboring gates) to cause a quantum dot (e.g., an electron spin-based quantum dot) to form in a quantum well stack 146 under the quantum dot gate. Electrical signals (e.g., voltages, radio frequency (RF), and/or microwave signals) may be provided to a barrier gate to control the potential energy barrier between adjacent quantum dots.

In the quantum dot device 100 of FIG. 1, a gate dielectric 114 is disposed on a quantum well stack 146. A quantum well stack 146 may include at least one quantum well layer 152 (not shown in FIG. 1, but discussed below) in which quantum dots may be localized during operation of the quantum dot device 100; examples of quantum well stacks 146 are discussed below with reference to FIG. 12. The gate dielectric 114 may be any suitable material, such as a high-k material. Multiple parallel lines of barrier gate metal 108 are disposed on the gate dielectric 114, and spacer material 118 is disposed on side faces of the barrier gate metal 108. In some embodiments, a patterned hardmask 110 may be disposed on the barrier gate metal 108 (with the pattern corresponding to the pattern of the barrier gate metal 108), and the spacer material 118 may extend up the sides of the hardmask 110, as shown. In some embodiments, an additional hardmask 112 may be disposed on the hardmask 110 (such that there are two hardmasks above the barrier gate metal 108), and this additional hardmask 112 may be patterned as illustrated in FIG. 1D to extend over adjacent pairs of barrier gate metal 108 segments. As shown in FIGS. 1B and 1D, in some embodiments, additional insulating material 128 (e.g., an interlayer dielectric (ILD)) may be disposed on this additional hardmask 112. In some embodiments, insulating material 128 (e.g., an ILD) may be disposed between the two hardmasks 110 and 112. The barrier gate metal 108 may provide barrier gates during operation of the quantum dot device 100, as discussed below. Different ones of the barrier gate lines 104 may be separately electrically controlled.

Multiple parallel lines of quantum dot (QD) gate metal may be disposed over the multiple parallel lines of barrier gate metal 108. As illustrated in FIG. 1A, the lines of quantum dot gate metal 106 may be arranged perpendicular to the lines of barrier gate metal 108. As illustrated in FIG. 1D, the area between adjacent pairs of barrier gate metal 108/spacer material 118 structures may be alternatingly filled with an insulating material 128 (e.g., an ILD) and the quantum dot gate metal 106. The quantum dot gate metal 106 may extend over the additional hardmask 112 and additional insulating material 128 above the barrier gate metal 108, and may extend down into the space between adjacent ones of the barrier gate metal 108/spacer material 118 structures. The quantum dot gate metal 106 that extends between adjacent ones of the barrier gate metal 108/spacer material 118 structures may provide a quantum dot gate 150 during operation of the quantum dot device 100 such that quantum dots form in the quantum well stack 146 below the quantum dot gates 150, as discussed below. The quantum dot gates 150 may alternate with stubs 122 that do not extend as far toward the quantum well stack 146, as shown. Multiple ones of the quantum dot gates 150 in a quantum dot gate line 102 are electrically continuous due to the continuous quantum dot gate metal 106 over the barrier gates 160; different ones of the quantum dot gate lines 102 may be separately electrically controlled. As illustrated in FIGS. 1B and 1C, upper portions of the quantum dot gate lines 102 may have spacer material 118 disposed on the top and side faces. Different portions of the quantum dot gate metal 106 may also have gate dielectric 114 disposed on the bottom and side faces, as shown.

Although FIG. 1 illustrates a particular number of quantum dot gate lines 102 and barrier gate lines 104, this is simply for illustrative purposes, and any number of quantum dot gate lines 102 and barrier gate lines 104 may be included in a quantum dot device 100. Other examples of quantum dot gate line 102 and barrier gate line 104 arrangements are discussed below with reference to FIGS. 3, 4, and 6-8. Electrical interconnects (e.g., vias and conductive lines) may make contact with the quantum dot gate lines 102 and barrier gate lines 104 in any desired manner; some example arrangements are discussed below with reference to FIG. 9. Examples of methods of performing quantum operations with the quantum dot device 100 of FIG. 1 (or similar devices) are discussed below with reference to FIGS. 6-8.

Not illustrated in FIG. 1, but illustrated in FIG. 4, are accumulation regions 162 that may be electrically coupled to the quantum well layer of the quantum well stack 146. The accumulation regions 162 may be regions in which carriers accumulate (e.g., due to doping, or due to the presence of large electrodes that pull carriers into the quantum well layer), and may serve as reservoirs of carriers that can be selectively drawn into the areas of the quantum well layer under the quantum dot gates (e.g., by controlling the voltages on the quantum dot gates and the barrier gates 160) to form carrier-based quantum dots (e.g., electron or hole quantum dots). In other embodiments (e.g., as discussed below with reference to FIG. 12), a quantum dot device 100 may not include lateral accumulation regions 162, but may instead include doped layers within the quantum well stack 146. These doped layers may provide the carriers to the quantum well layer. Any combination of accumulation regions 162 (e.g., doped or non-doped) or doped layers in a quantum well stack 146 may be used in any of the embodiments of the quantum dot devices 100 disclosed herein.

Figure 2A:
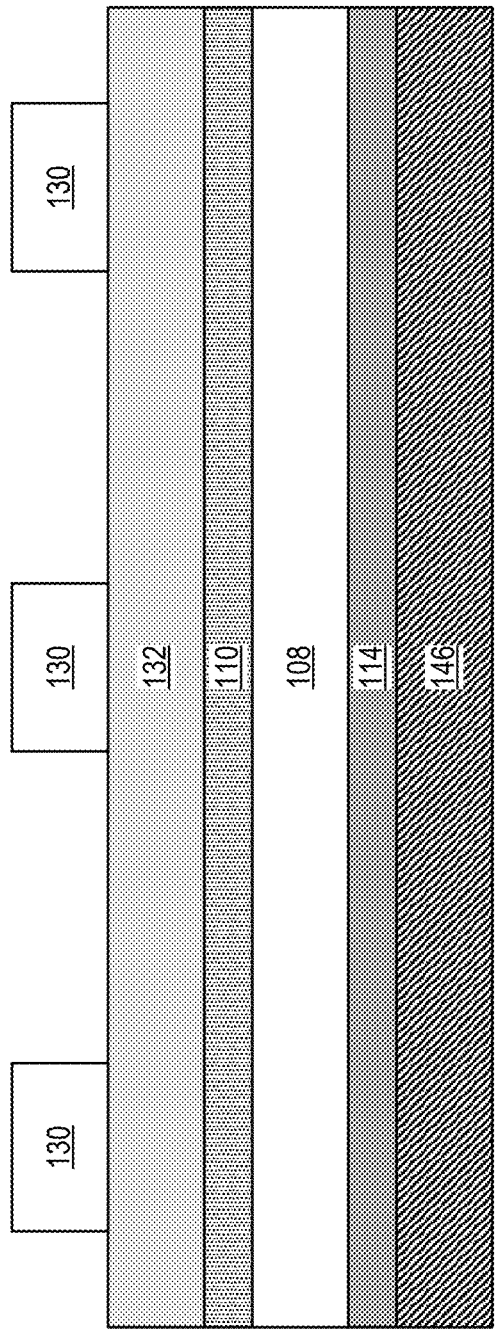
FIGS. 2A-2U illustrate various example stages in the manufacture of a quantum dot device, in accordance with various embodiments.
Figure 2B:
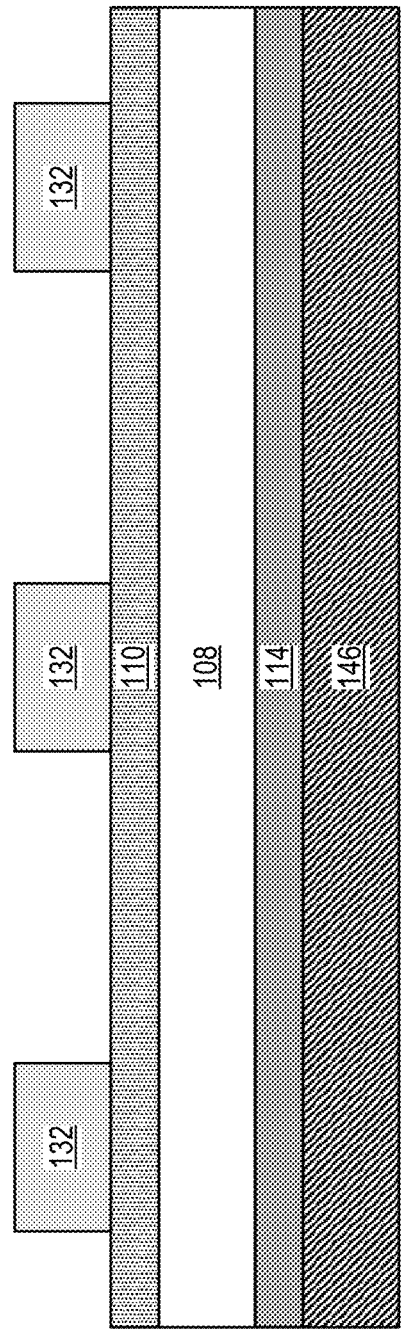
Figure 2C:
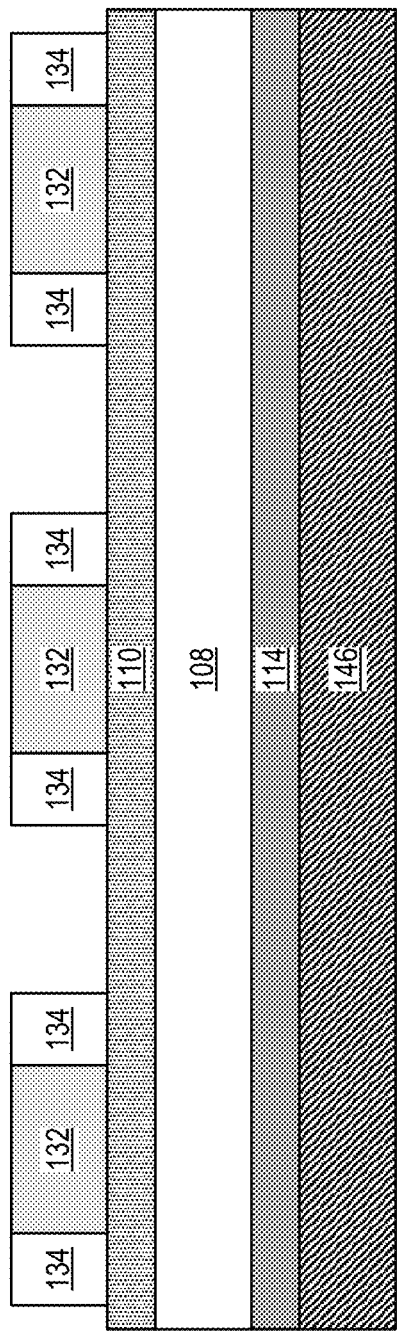
Figure 2D:
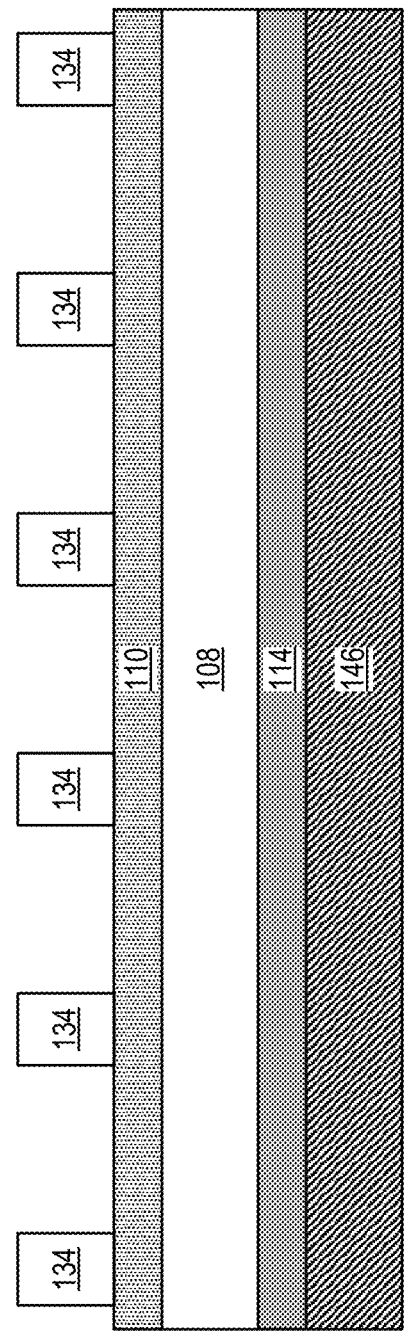
Figure 2E:
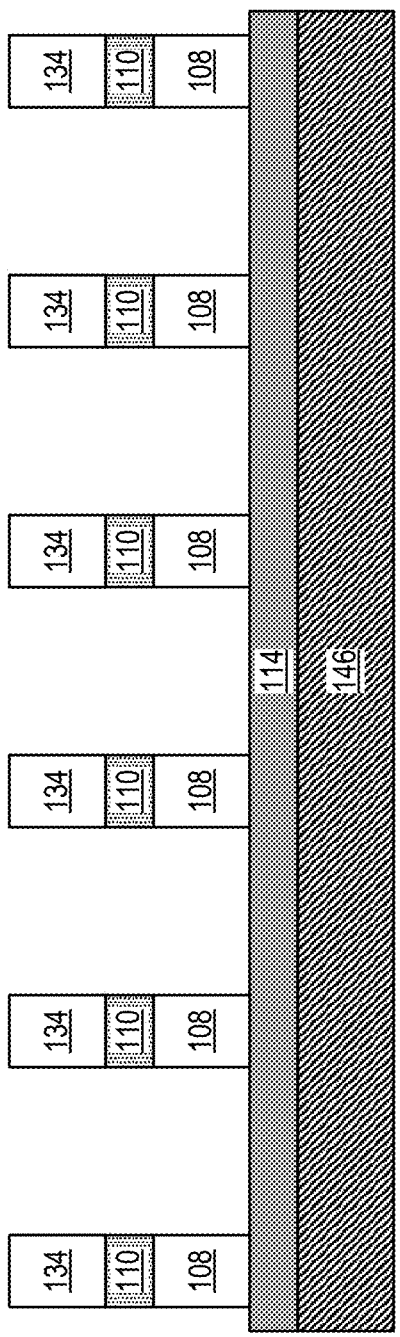
Figure 2F:
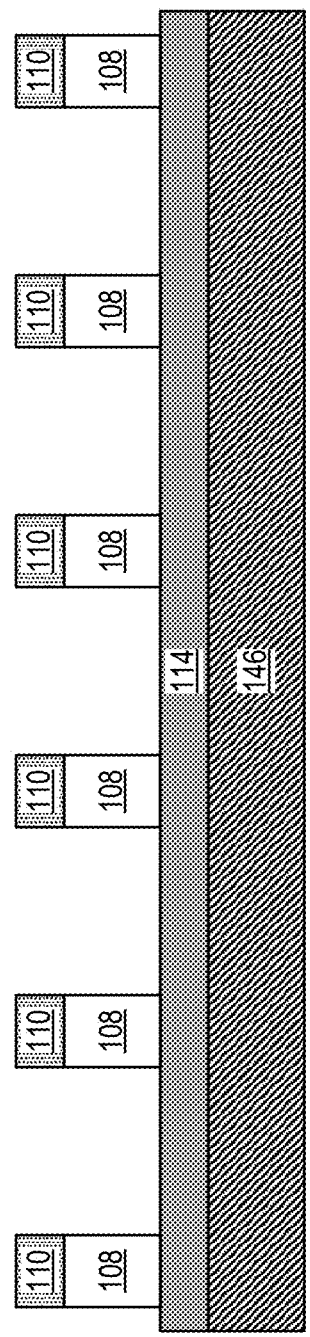
Figure 2G:
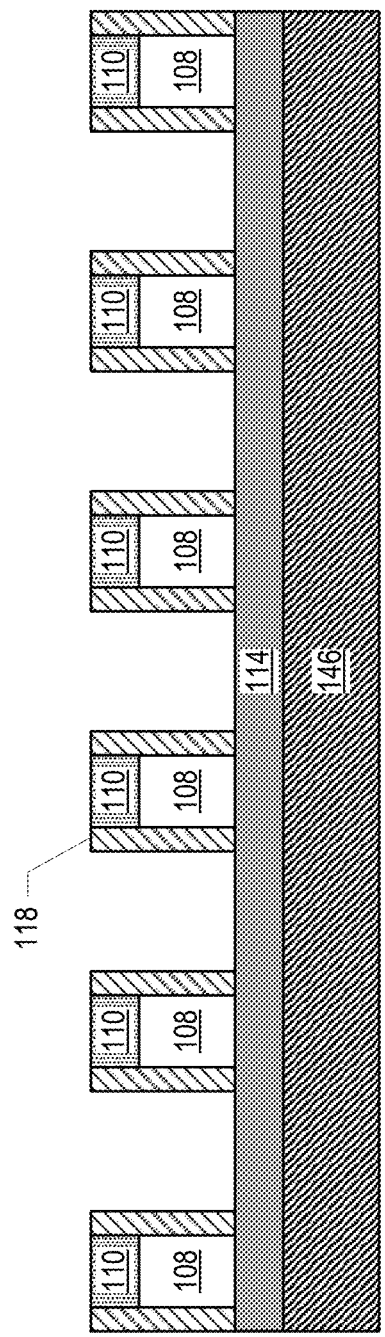
Figure 2H:
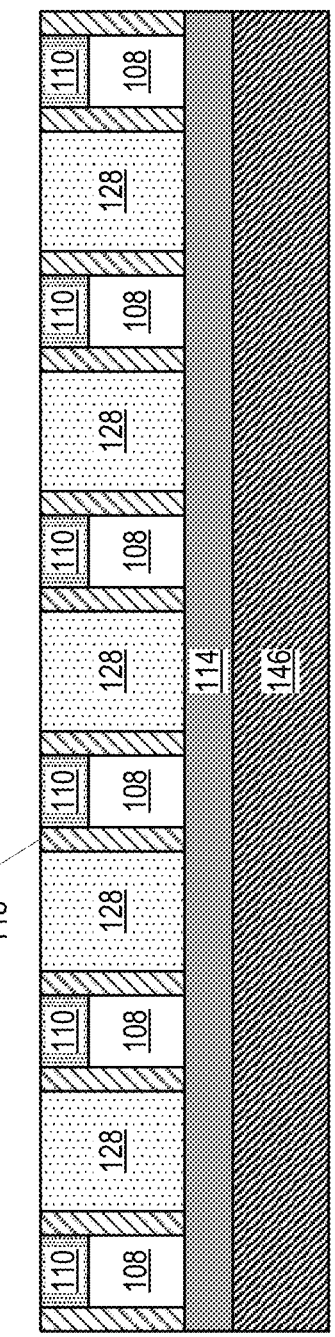
Figure 2I:
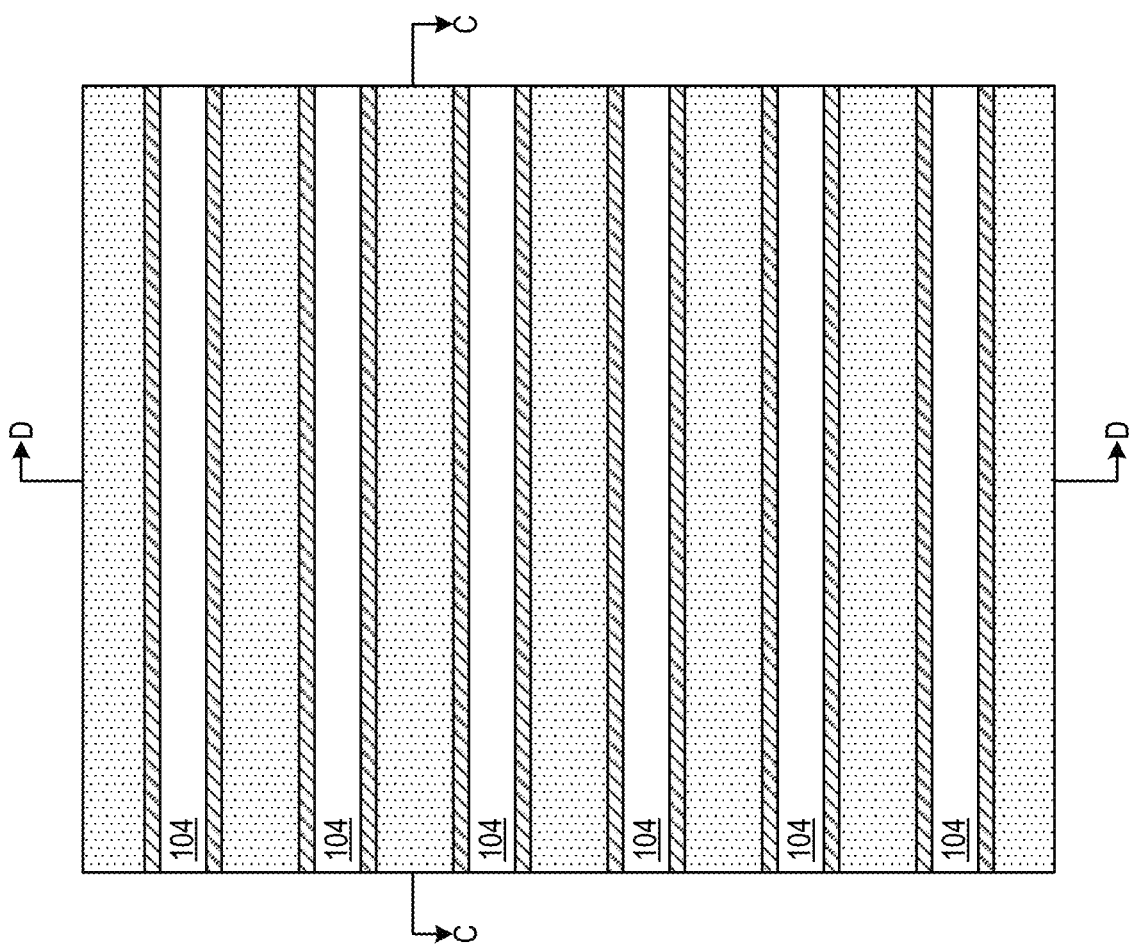
Figure 2J:
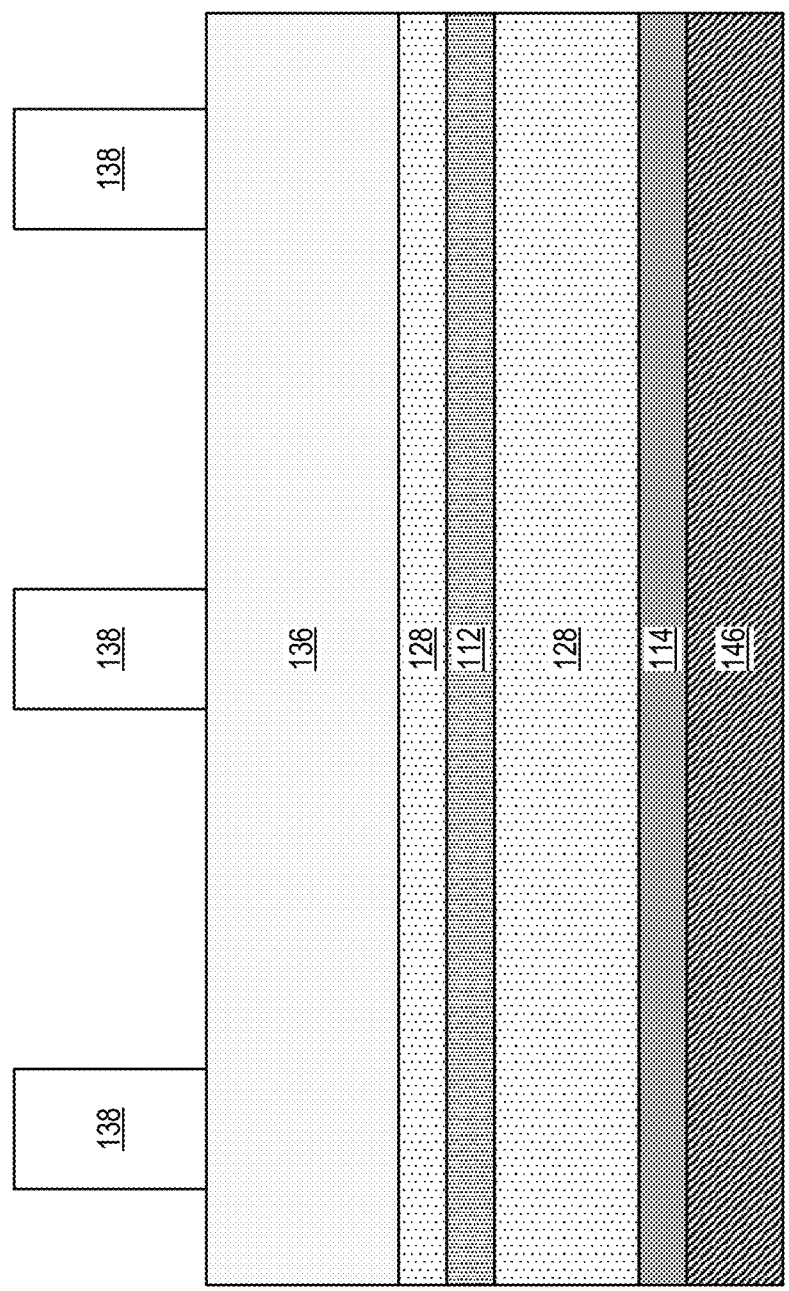
Figure 2K:
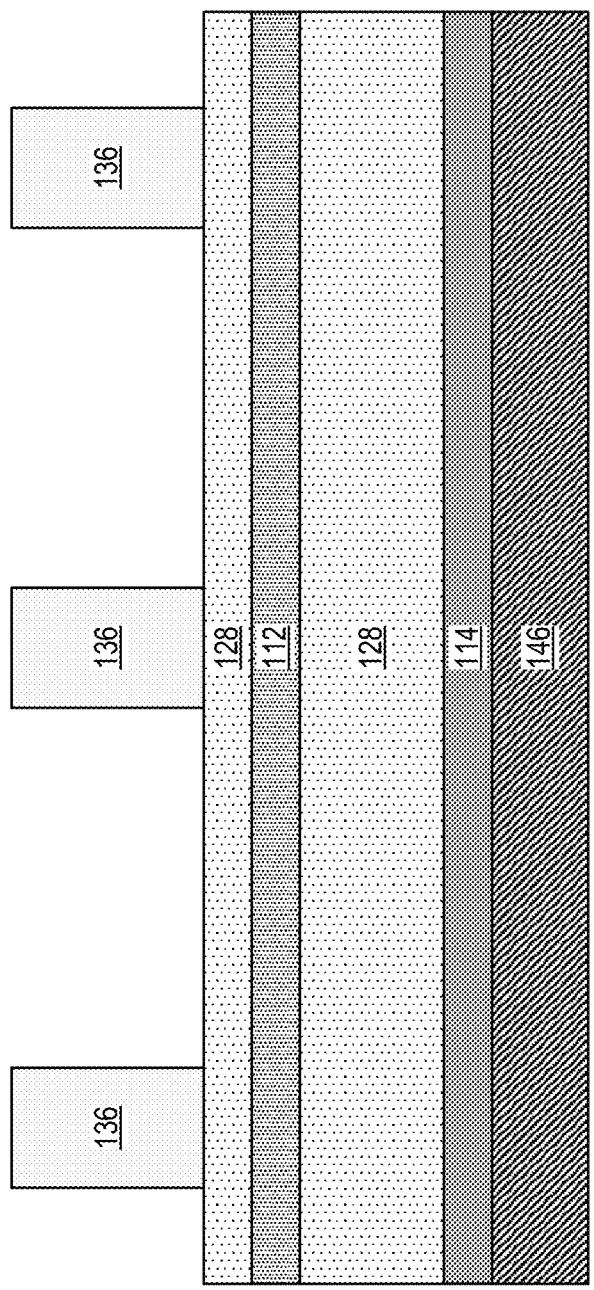
Figure 2L:
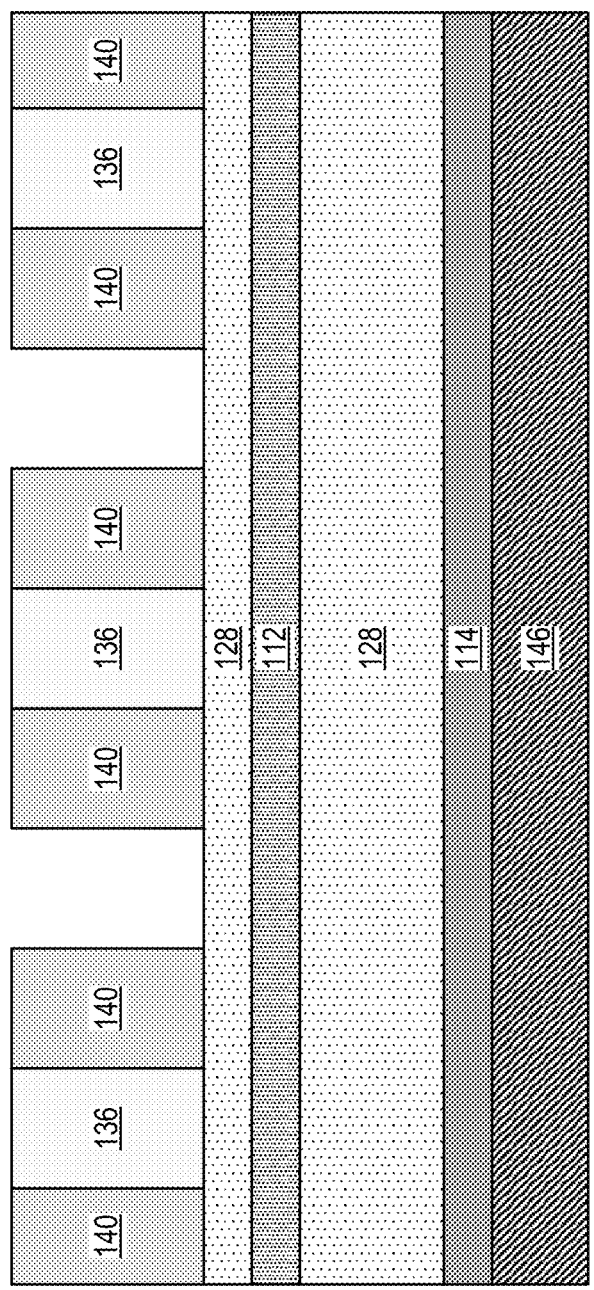
Figure 2M:
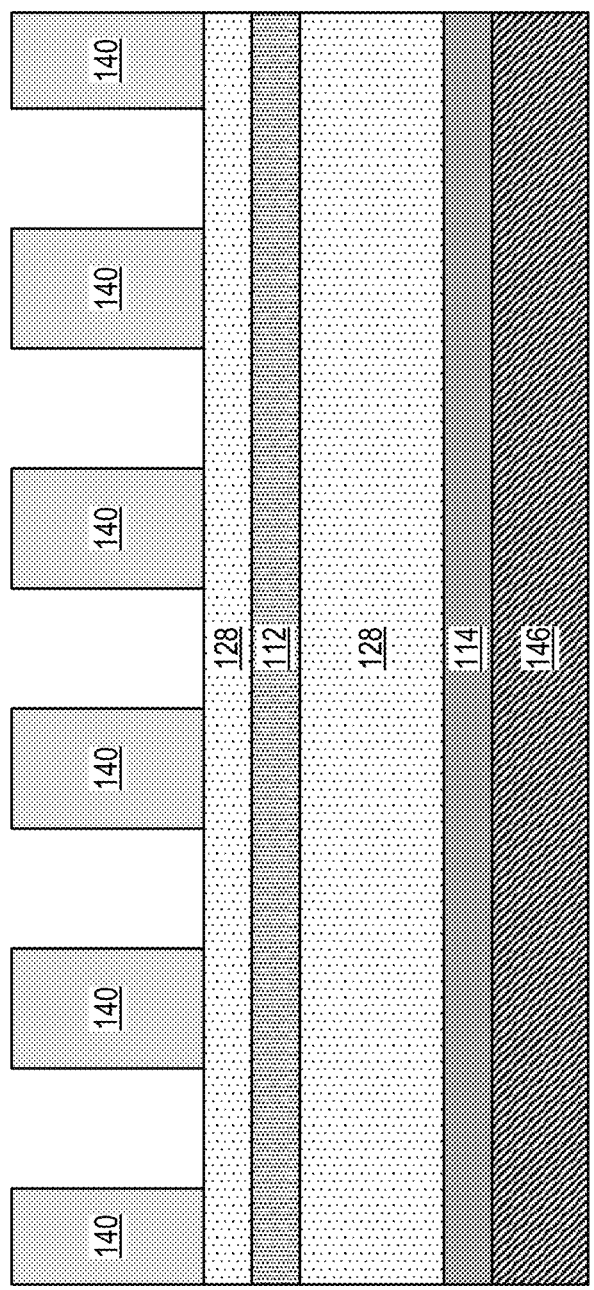
Figure 2N:
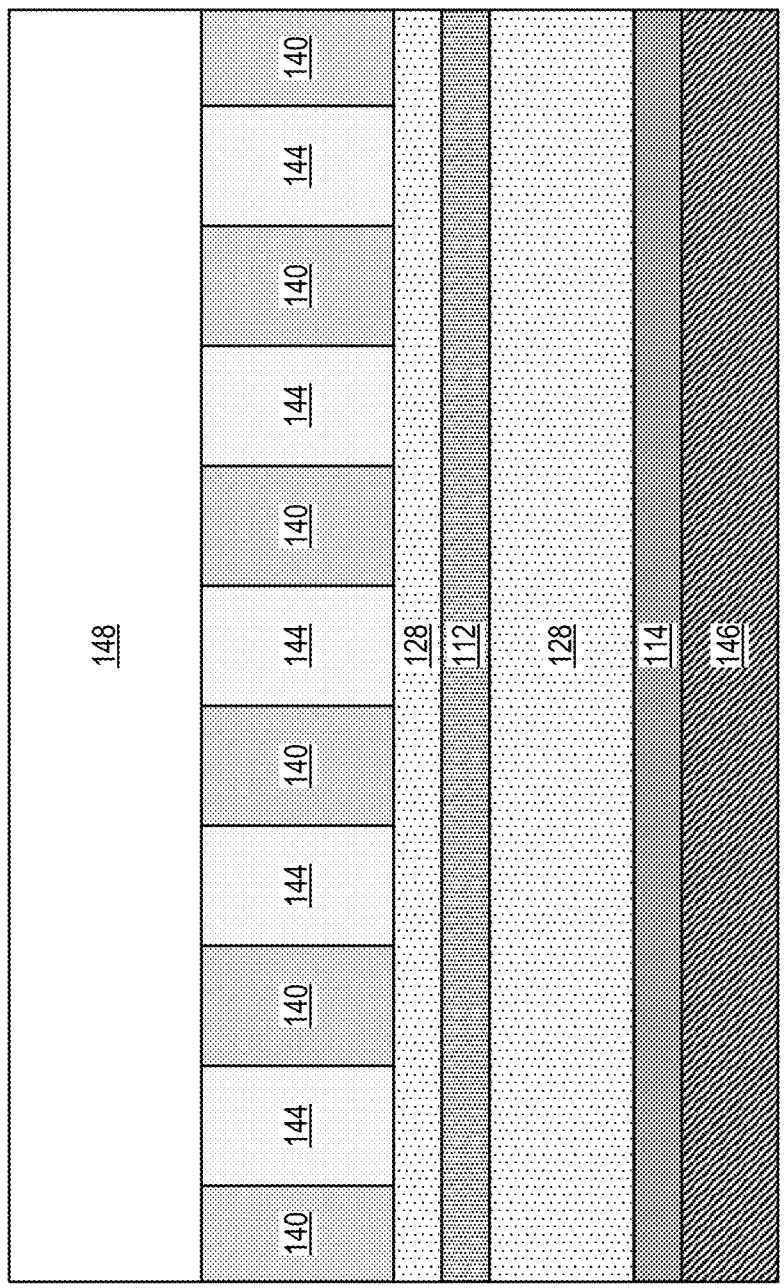
Figure 20:
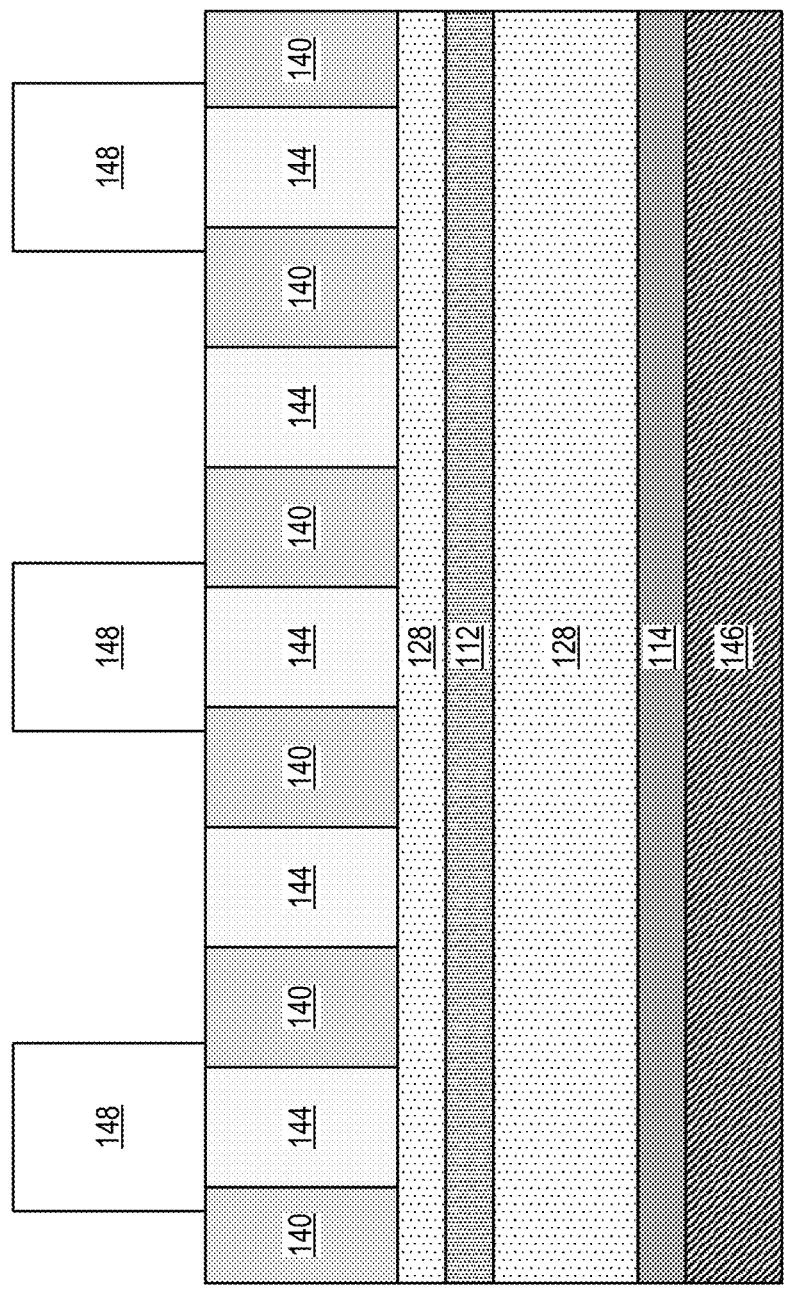
Figure 2P:
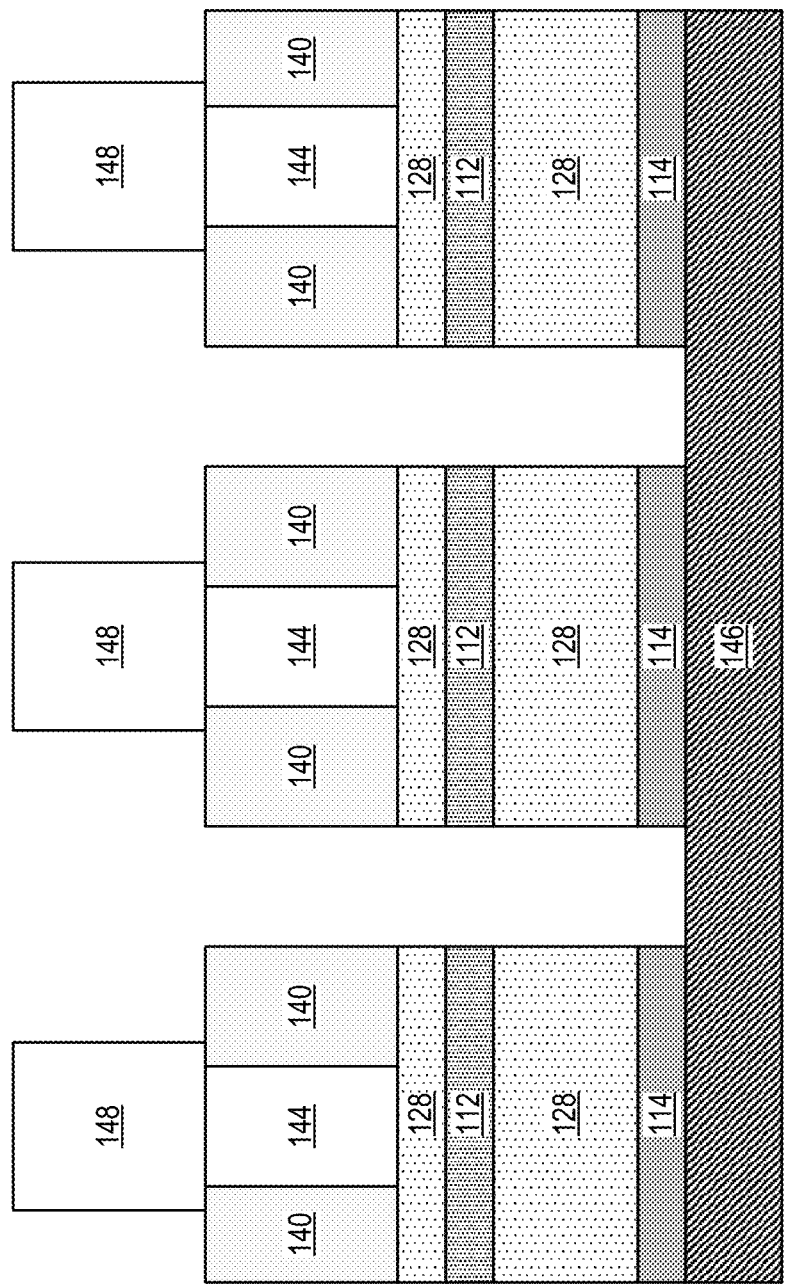
Figure 2Q:
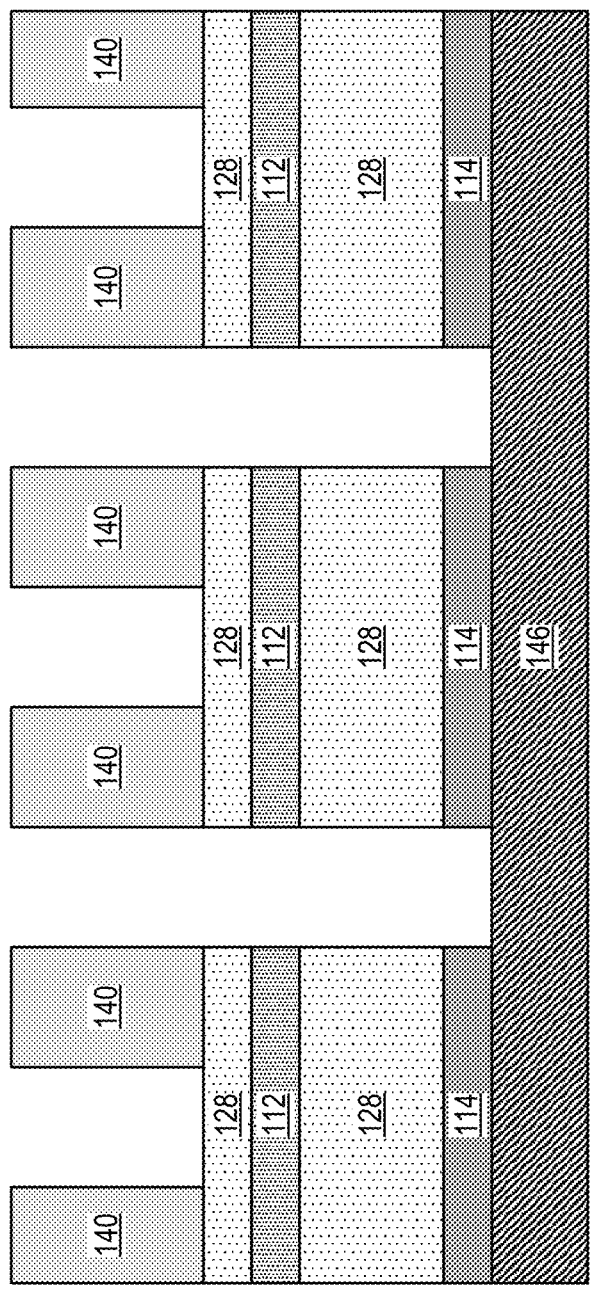
Figure 2T:
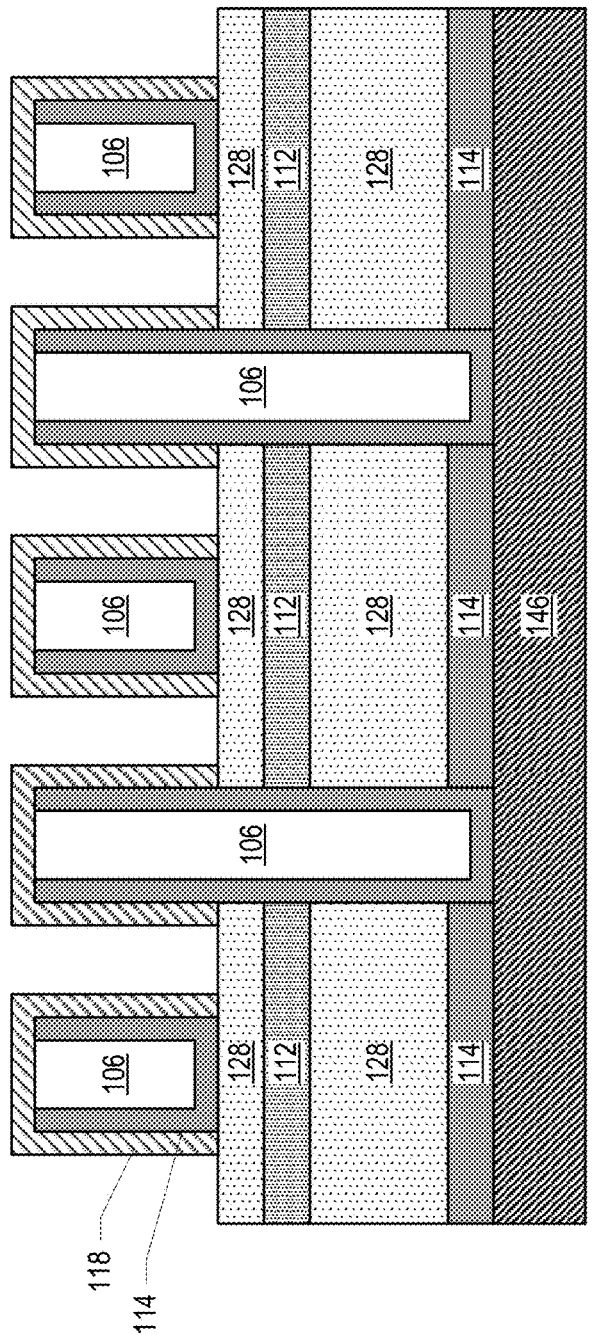
Figure 2U:
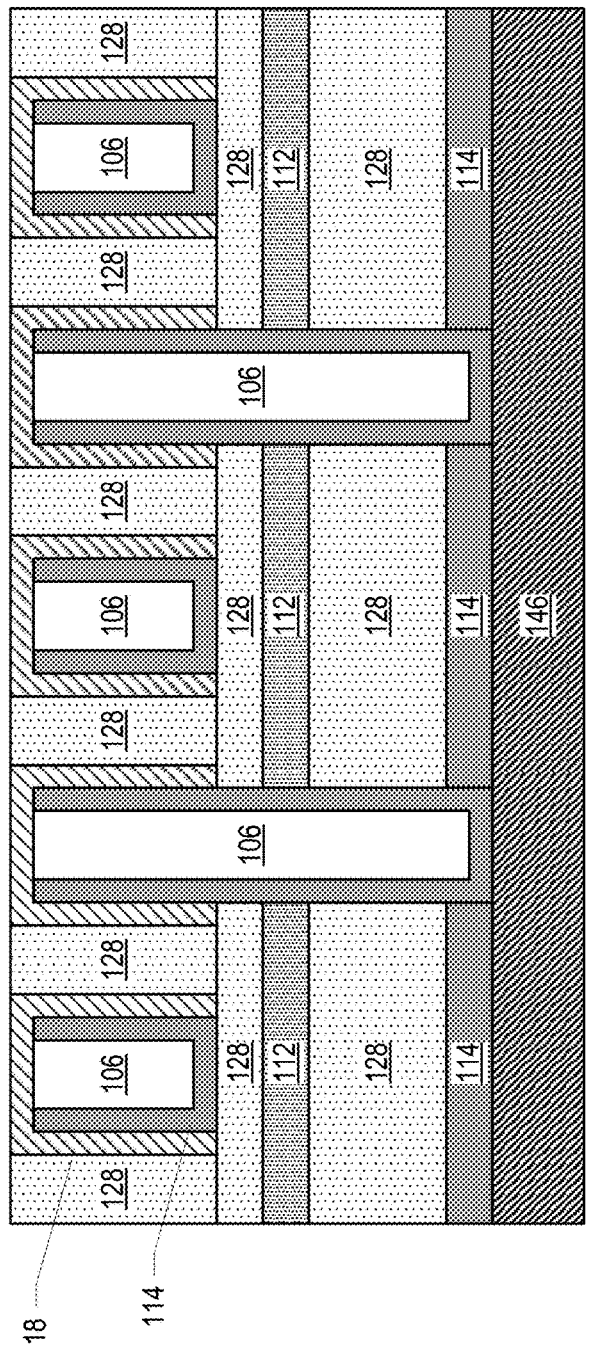

FIGS. 2A-2U illustrate various example stages in the manufacture of a quantum dot device 100, in accordance with various embodiments. The views illustrated in FIGS. 2A-2H are taken along the cross section of FIG. 1D, the view illustrated in FIG. 2I is a top view similar to the top view of FIG. 1A, and the views illustrated in FIGS. 2J-2U are taken along the cross section of FIG. 1C.

FIG. 2A illustrates an assembly including a quantum well stack 146, a gate dielectric 114 disposed on the quantum well stack 146, a barrier gate metal 108 disposed on the gate dielectric 114, a hardmask 110 disposed on the barrier gate metal 108, a template material 132 disposed on the hardmask 110, and a patterned photoresist 130 disposed on the template material 132. The photoresist 130 may be any suitable material, and may be patterned using any suitable technique. In some embodiments, the template material 132 may be amorphous silicon, or any other suitable material.

FIG. 2B illustrates an assembly subsequent to patterning the template material 132 of the assembly of FIG. 2A in accordance with the pattern of the photoresist 130, then removing the photoresist 130. Any suitable etch process may be used to pattern the template material 132.

FIG. 2C illustrates an assembly subsequent to providing spacer material 134 on side faces of the patterned template material 132 of the assembly of FIG. 2B. The spacer material 134 of FIG. 2C may be formed by depositing a conformal layer of the spacer material 134 over the patterned template material 132, then performing a directional etch to etch the spacer material 134 "downward," leaving the spacer material 134 on the sides of the patterned template material 132. The spacer material 134 may be an insulating material, for example.

FIG. 2D illustrates an assembly subsequent to removing the template material 132 from the assembly of FIG. 2C. The template material 132 may be removed using any suitable etch process.

FIG. 2E illustrates an assembly subsequent to etching the hardmask 110 and the barrier gate metal 108 of the assembly of FIG. 2D in accordance with the pattern provided by the spacer material 134 (i.e., the hardmask 110 and barrier gate metal 108 not masked by the spacer material 134 may be removed). Any suitable etch process may be used to pattern the hardmask 110 and the barrier gate metal 108. In some embodiments, as shown, the etch may stop at the gate dielectric 114, while in other embodiments, the etch may continue through the gate dielectric 114.

FIG. 2F illustrates an assembly subsequent to removing the spacer material 134 of the assembly of FIG. 2E. Any suitable technique may be used.

FIG. 2G illustrates an assembly subsequent to providing spacer material 118 on side faces of the patterned hardmask 110 and barrier gate metal 108 of the assembly of FIG. 2F. The spacer material 118 of FIG. 2G may be formed using the techniques discussed above with reference to FIG. 2C, for example.

FIG. 2H illustrates an assembly subsequent to providing an insulating material 128 on the assembly of FIG. 2G. The insulating material 128 may be, for example, an ILD. In some embodiments, the insulating material 128 may fill the area above the gate dielectric 114 between adjacent portions of spacer material 118 and extend over the hardmask 110, as shown. In some embodiments, the insulating material 128 may be planarized after deposition (e.g., using a chemical mechanical polishing (CMP) technique). FIG. 2I is a "top" view of the assembly of FIG. 2H, with some of the insulating material 128 removed to show the barrier gate lines 104.

FIG. 2J is a cross-sectional view through the dashed line of FIG. 2I, subsequent to providing an additional hardmask 112 on the insulating material 128 of FIG. 2I, as well as providing additional insulating material 128, template material 136, and a patterned photoresist 138. The additional insulating material 128 may take the form of any of the insulating materials 128 discussed above with reference to FIG. 2H. The additional hardmask 112 may take the form of any of the hardmasks discussed above with reference to FIG. 2A. The template material 136 and patterned photoresist 138 may take the form of any of the template materials and patterned photoresists, respectively, discussed above with reference to FIG. 2A.

FIG. 2K illustrates an assembly subsequent to patterning the template material 136 of the assembly of FIG. 2J in accordance with the pattern of the photoresist 138, then removing the photoresist 138. Any suitable etch process may be used to pattern the template material 136.

FIG. 2L illustrates an assembly subsequent to providing spacer material 140 on side faces of the patterned template material 136 of the assembly of FIG. 2K. The spacer material 140 of FIG. 2L may be formed using the techniques discussed above with reference to FIG. 2C, for example.

FIG. 2M illustrates an assembly subsequent to removing the template material 136 from the assembly of FIG. 2L. The template material 136 may be removed using any suitable etch process.

FIG. 2N illustrates an assembly subsequent to depositing additional template material 144 on the assembly of FIG. 2M, planarizing that additional template material 144, and depositing additional photoresist 148 on the additional template material 144. The additional photoresist 148 may be deposited using any suitable technique, such as spin coating.

FIG. 2O illustrates an assembly subsequent to forming openings in the photoresist 148 of the assembly of FIG. 2N to expose alternating portions of the additional template material 144, as shown. The openings may be formed using via lithography, or any other suitable process, and may have a circular cross section when viewed from above.

FIG. 2P illustrates an assembly subsequent to etching the additional template material 144, the insulating material 128, the gate dielectric 114, and the additional hardmask 112 in accordance with the pattern provided by the patterned photoresist 148 and spacer material 140 (i.e., the additional template material 144, the insulating material 128, the gate dielectric 114, and the additional hardmask 112 not masked by the photoresist 148 or the spacer material 140 may be removed). Any suitable etch process may be used to pattern the additional template material 144, the additional hardmask 112, the gate dielectric 114, and the insulating material 128. In some embodiments, as shown, the etch may continue through the gate dielectric 114, while in other embodiments, the etch may stop without removing any of the gate dielectric 114.

FIG. 2Q illustrates an assembly subsequent to removing the photoresist 148 and the additional template material 144 of the assembly of FIG. 2P. Any suitable technique may be used.

FIG. 2R illustrates an assembly subsequent to depositing a conformal gate dielectric 114 over the assembly of FIG. 2Q followed by the deposition and planarization of the quantum dot gate metal 106 (e.g., by CMP). The assembly of FIG. 2R thus includes alternating stubs 122 (which may not provide gate functionality during operation) and quantum dot gates 150 (which extend closer to the quantum well stack 146, and thus may provide gate functionality during operation).

FIG. 2S illustrates an assembly subsequent to removing the spacer material 140 of the assembly of FIG. 2R. Any suitable technique may be used.

FIG. 2T illustrates an assembly subsequent to providing spacer material 118 on the assembly of FIG. 2S. In some embodiments, the spacer material 118 may be conformal, and may be directionally etched as discussed previously. In some embodiments, some of the spacer material 118 may remain on "top" of the quantum dot gate metal 106, as well as on the side faces of the quantum dot gate metal 106.

FIG. 2U illustrates an assembly subsequent to providing an insulating material 128 on the assembly of FIG. 2T. The insulating material 128 may be, for example, an ILD. In some embodiments, the insulating material 128 may fill the area above the insulating material 128 between adjacent portions of spacer material 118. In some embodiments, the insulating material 128 may be planarized after deposition (e.g., using CMP). The assembly of FIG. 2U may take the form of the quantum dot device 100 illustrated in FIG. 1.

Figure 3:
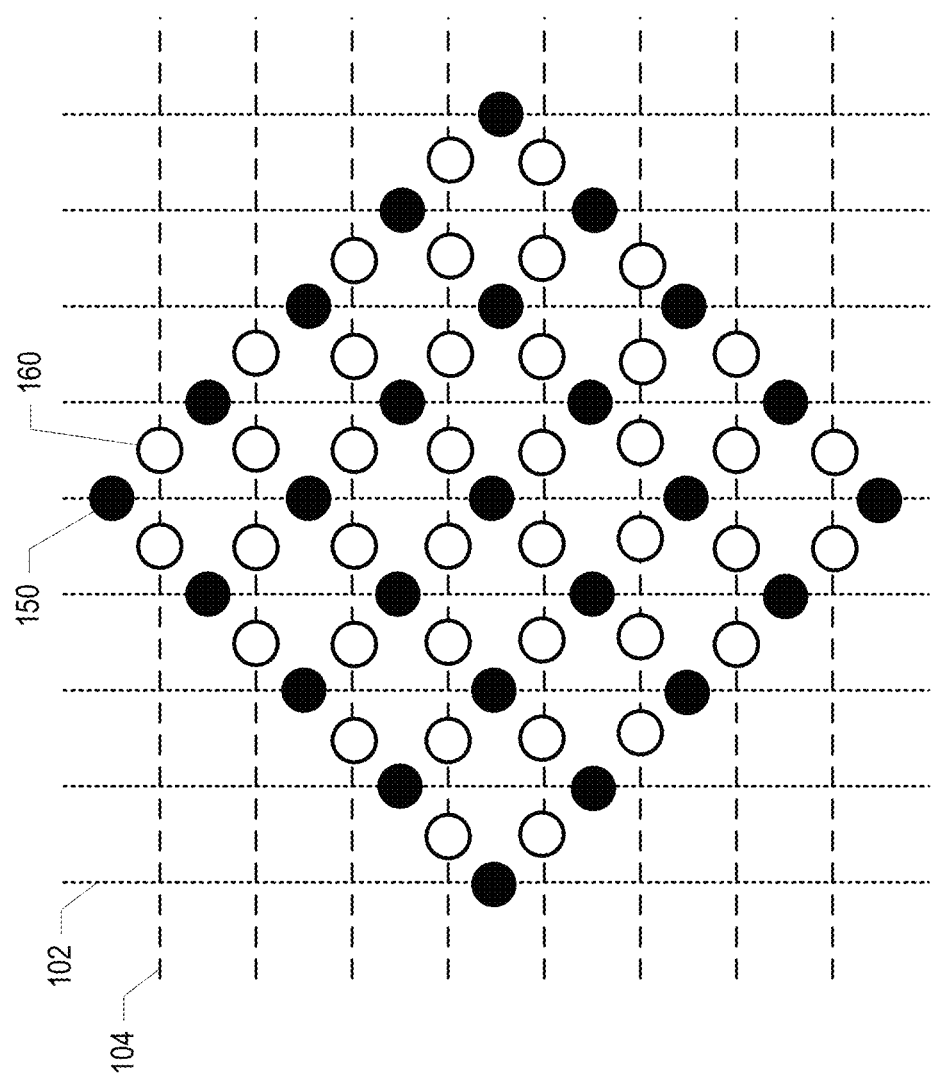
FIG. 3 is a view of a quantum dot device, in accordance with various embodiments.

FIG. 3 is a view of a quantum dot device 100, in accordance with various embodiments. In particular, FIG. 3 schematically illustrates a quantum dot device 100 having a two-dimensional arrangement of barrier gates 160 and quantum dot gates 150. In some embodiments, the quantum dot device 100 schematically illustrated in FIG. 3 may take the form of any of the quantum dot devices 100 discussed above with reference to FIGS. 1 and 2. In such embodiments, multiple ones of the barrier gates 160 illustrated in FIG. 3 as connected by a barrier gate line 104 may physically take the form of a single elongated barrier gate, as discussed above with reference to FIG. 3, while multiple ones of the quantum dot gates 150 illustrated in FIG. 3 as connected by a quantum dot gate line 102 may take the form of an electrically continuous structure having alternating quantum dot gates 150 and stubs 122, as discussed above.

In FIG. 3, barrier gates 160 arranged along a barrier gate line 104 are electrically continuous, and thus any voltage applied to a barrier gate line 104 will be applied to all of the barrier gates 160 along that line. Similarly, quantum dot gates 150 arranged along a quantum dot gate line 102 are electrically continuous, and thus any voltage applied to a quantum dot gate line 102 will be applied to all of the quantum dot gates 150 along that line. In the quantum dot device 100 of FIG. 3, the barrier gate lines 104 are parallel to each other, the quantum dot gate lines 102 are parallel to each other, and the barrier gate lines 104 are perpendicular to the quantum dot gate lines 102.

The quantum dot gates 150 in the quantum dot device 100 of FIG. 3 (and the quantum dot devices 100 of FIGS. 1 and 4-9) are arranged as points in a grid, and different ones of the quantum dot gate lines 102 are electrically coupled to different diagonals in that grid. The barrier gates 160 in the quantum dot device 100 of FIG. 3 (and the quantum dot devices 100 of FIGS. 1 and 4-9) are arranged as points in a grid, and different ones of the barrier gate lines 104 are electrically coupled to different rows in that grid. The grid underlying the quantum dot gates 150 is rotated 45 degrees with reference to the grid underlying the barrier gates 160.

In the quantum dot device 100 of FIG. 3, the quantum dot gates 150 in each nearest neighbor pair have a barrier gate disposed between them. The quantum dot gate lines 102 connect quantum dot gates 150 along the diagonal of the underlying grid. As discussed in further detail below, during operation of the quantum dot device 100 of FIG. 3, quantum interactions between nearest neighbor quantum dots under different ones of the quantum dot gates 150 may be controlled in part by the potential energy barrier provided by the intervening barrier gates 160.

Figure 4A:
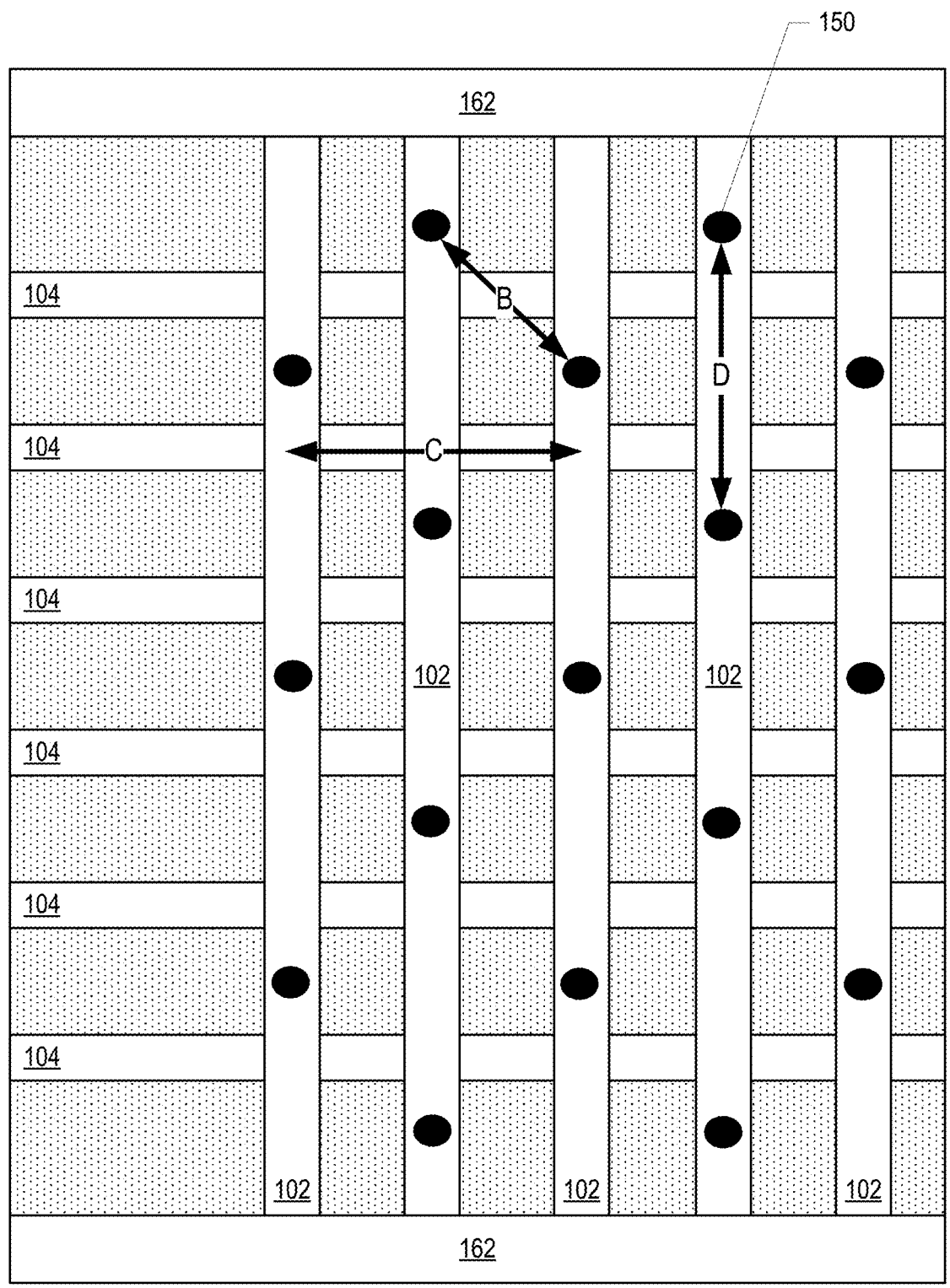
FIGS. 4A-4D are various views of a quantum dot device, in accordance with various embodiments.
Figure 4D:
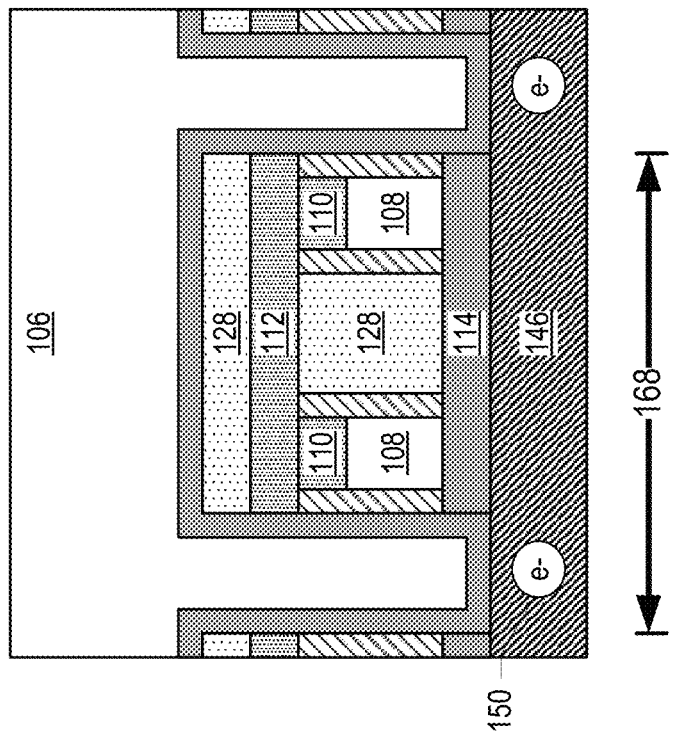
Figure 4B:
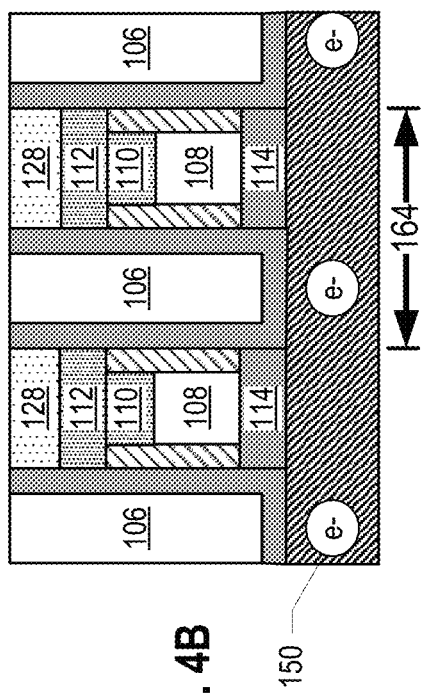
Figure 4C:
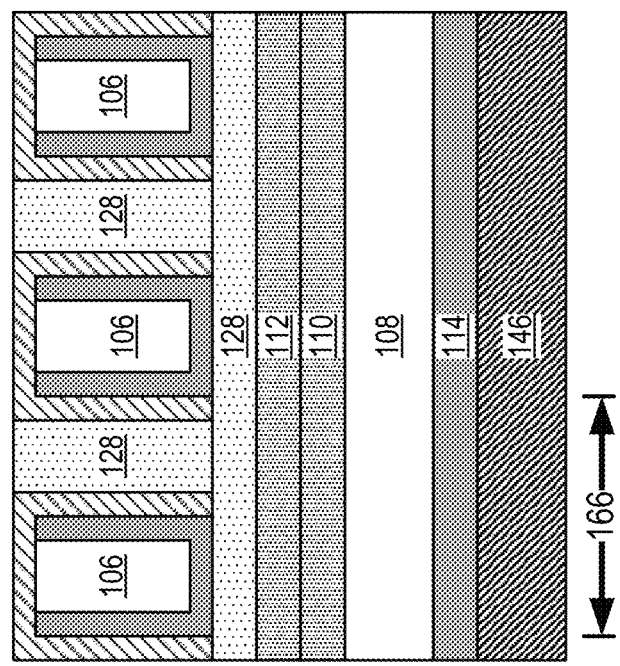

FIGS. 4A-4D are various views of a quantum dot device 100, in accordance with various embodiments. In particular, FIG. 4A is a "top" view similar to the views of FIGS. 1A and 3, FIG. 4B is a cross-sectional view corresponding to the arrow marked "B" in FIG. 4A, FIG. 4C is a cross-sectional view similar to that of FIG. 1B (and corresponding to the arrow marked "C" in FIG. 4A), and FIG. 4D is a cross-sectional view similar to that of FIG. 1D (and corresponding to the arrow marked "D" in FIG. 4A). The embodiment illustrated in FIG. 4 is substantially similar to that discussed above with reference to FIGS. 1 and 2, except that the gate dielectric 114 does not extend continuously over the quantum well stack 146, but is instead separately disposed between different portions of the gate metals and the quantum well stack 146. Such an arrangement may be manufactured by not initially depositing a gate dielectric 114, and instead depositing the gate dielectric 114 just prior to depositing the gate metal. FIGS. 4B-4D also include some example dimensions for example embodiments of the quantum dot devices 100 disclosed herein, as well as illustrating the location of quantum dots 142 (shown as "e–" electron-spin-based quantum dots) under the quantum dot gates 150. In some embodiments, the distance 164 may be between 50 nanometers and 200 nanometers (e.g., between 75 and 125 nanometers, between 80 and 90 nanometers, or approximately 84 nanometers). In some embodiments, the distance 166 may be between 25 and 100 nanometers (e.g., between 40 and 80 nanometers, or approximately 70 nanometers). In some embodiments, the distance 168 may be between 80 and 200 nanometers (e.g., between 100 and 150 nanometers, or approximately 120 nanometers). Comparing FIGS. 4B and 4D, nearest neighbor quantum dots (e.g., on the "diagonal") may be substantially closer together than quantum dots under adjacent quantum dot gates in a single quantum dot gate line 102, and thus the nearest neighbor quantum dots may be close enough to interact (while those under adjacent quantum dot gates in a single quantum dot gate line 102 may not be close enough to interact). Quantum operations using the quantum dot devices 100 disclosed herein may thus be said to take place "on the diagonal," as discussed in further detail below.

Figure 5A:
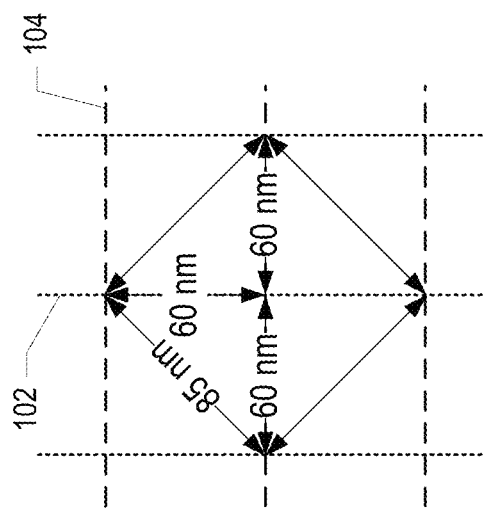
FIGS. 5A-5C illustrate various example dimensions of a quantum dot device, in accordance with various embodiments.
Figure 5B:
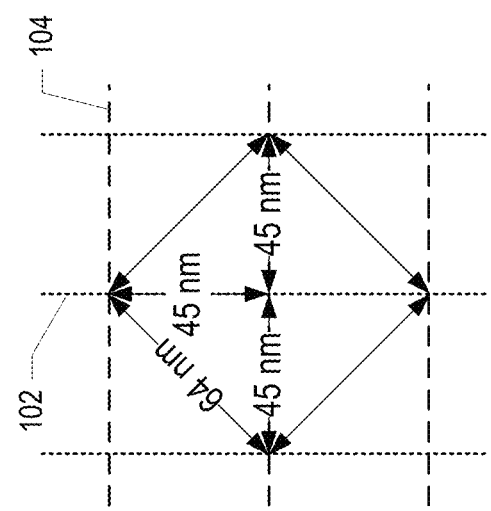
Figure 5C:
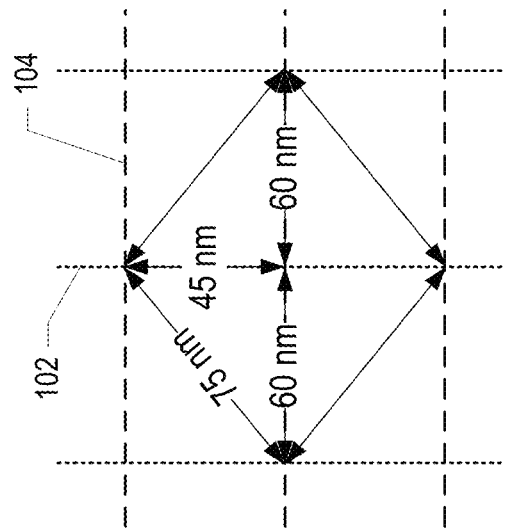

FIGS. 5A-5C illustrate various example dimensions of a quantum dot device 100, in accordance with various embodiments. For example, as illustrated in FIG. 5A, when the quantum dot gate lines 102 have a pitch of 60 nanometers, and the barrier gate lines 104 have a pitch of 60 nanometers, two quantum dots that form under nearest neighbor quantum dot gates (along the "diagonal") may be spaced apart by approximately 85 nanometers. As illustrated in FIG. 5B, when the quantum dot gate lines 102 have a pitch of 45 nanometers, and the barrier gate lines 104 have a pitch of 45 nanometers, two quantum dots that form under nearest neighbor quantum dot gates may be spaced apart by approximately 64 nanometers. As illustrated in FIG. 5C, when the quantum dot gate lines 102 have a pitch of 60 nanometers, and the barrier gate lines 104 have a pitch of 45 nanometers (or vice versa), two quantum dots that form under nearest neighbor quantum dot gates may be spaced apart by approximately 75 nanometers. Any other desired pitches or combinations of pitches may be used to pattern the quantum dot gate lines 102 and/or the barrier gate lines 104.

Figure 6:
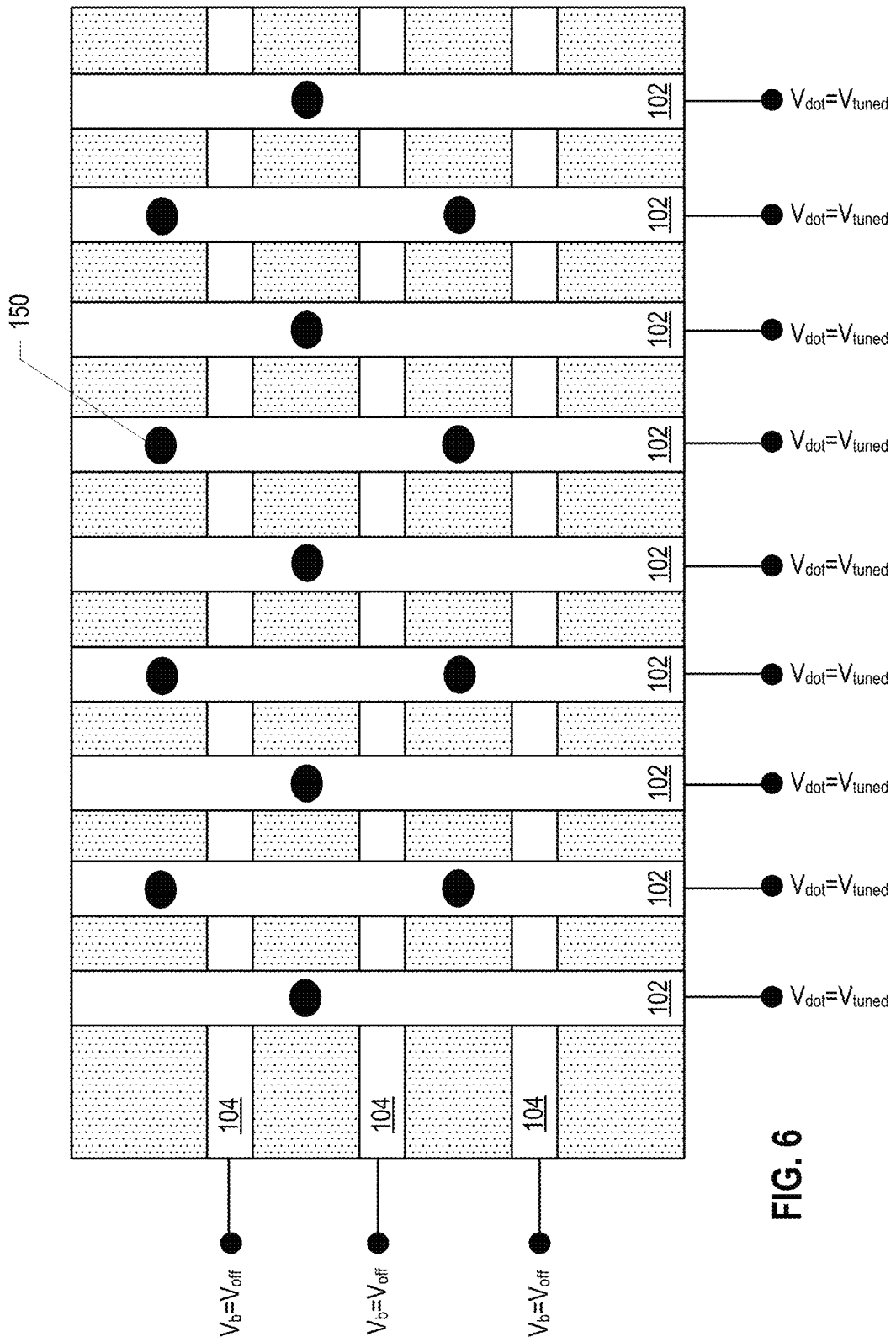
FIGS. 6-8 illustrate various electrical configurations that may be used to perform quantum operations on a quantum dot device, in accordance with various embodiments.
Figure 7:
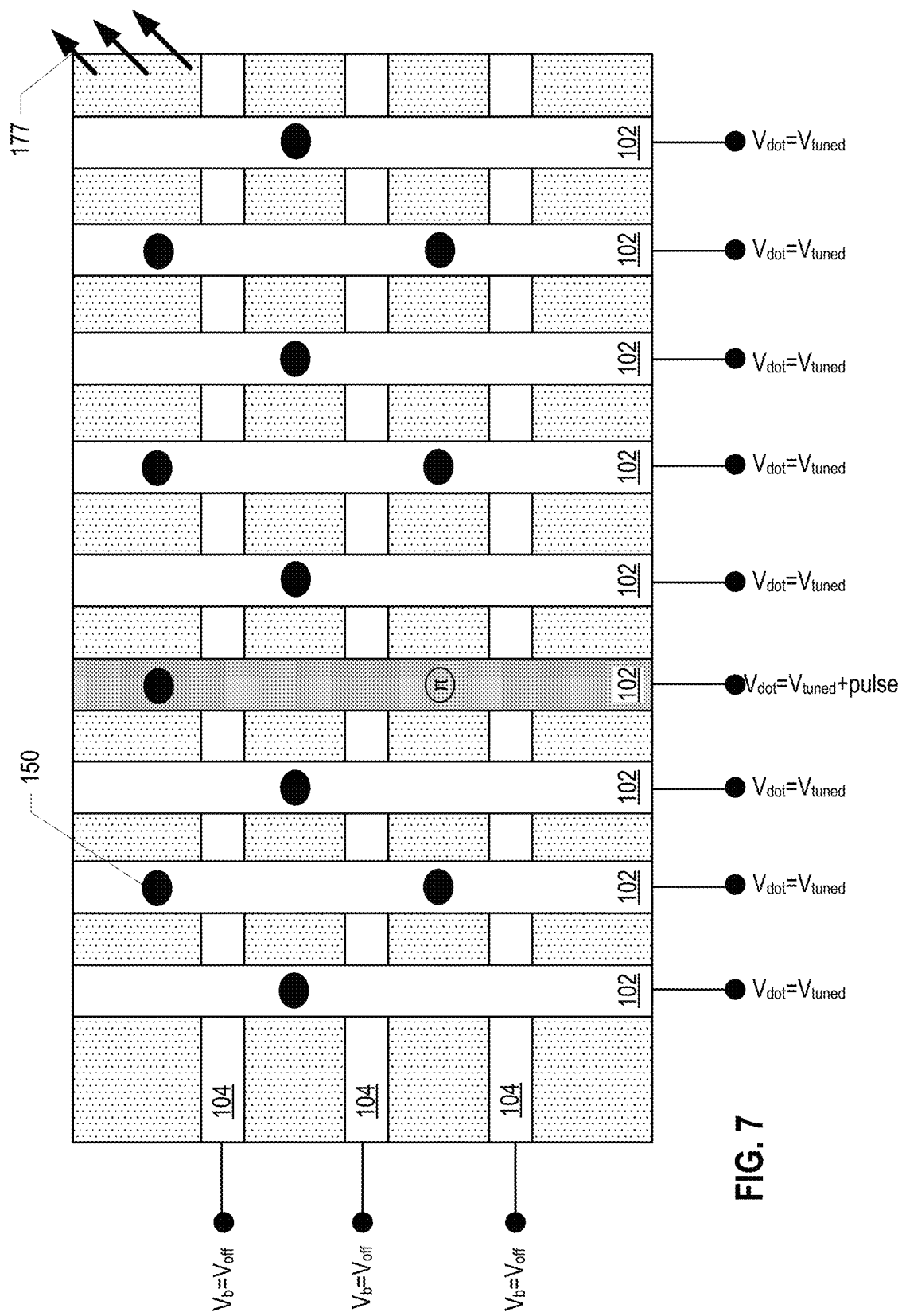
Figure 8:
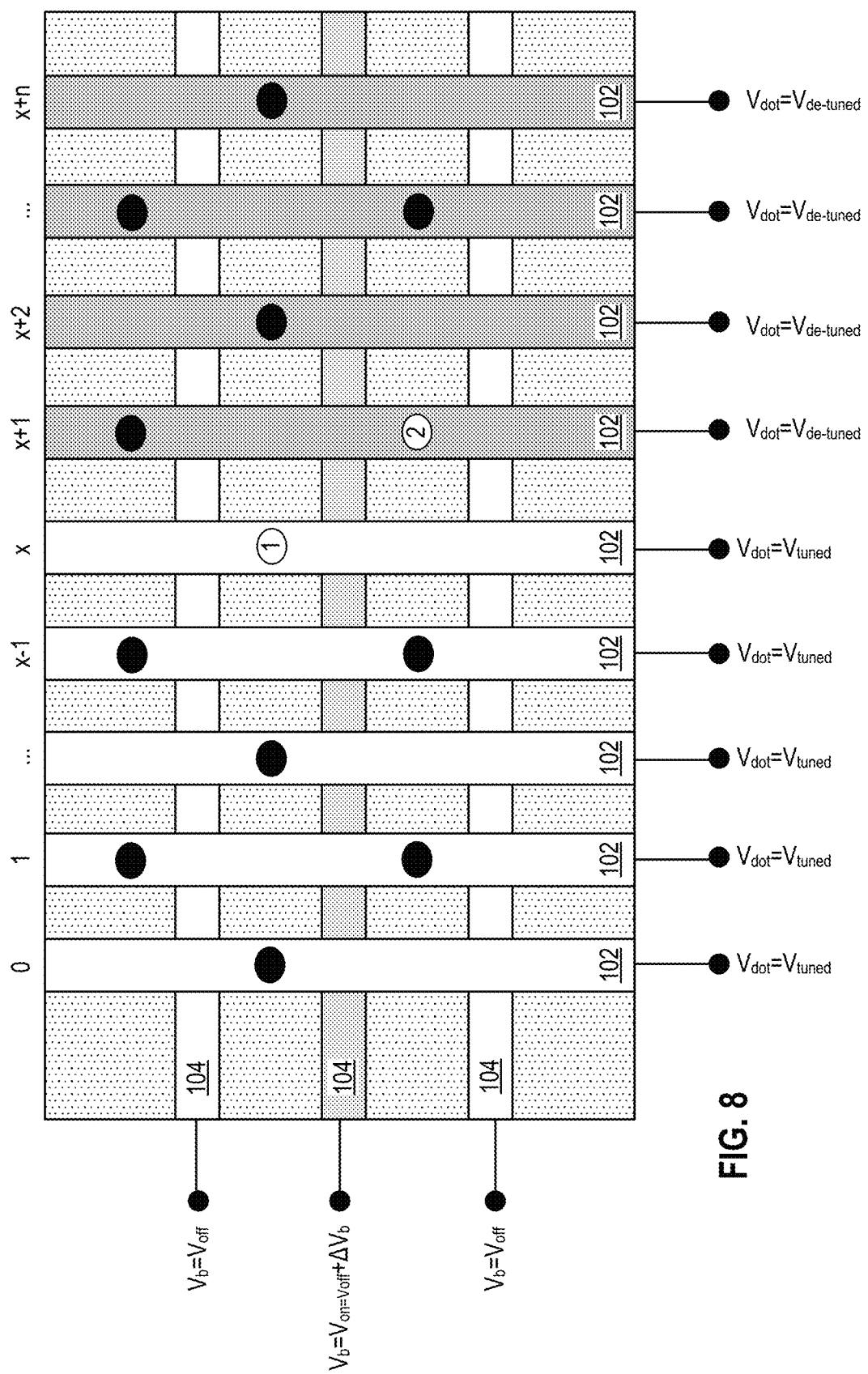

FIGS. 6-8 illustrate various electrical configurations that may be used to perform quantum operations in a quantum dot device 100, in accordance with various embodiments. The quantum dot device 100 schematically illustrated in FIGS. 6-8 may take the form of any of the quantum dot devices 100 disclosed herein (e.g., any of those discussed above with reference to FIGS. 1-5). The voltages applied to the gate lines, as discussed below with reference to FIGS. 6-8, may be controlled by any suitable control circuitry 175 (illustrated in FIG. 9). The control circuitry 175 may include multiplexers or other suitable circuitry for selectively applying voltages to various ones of the gate lines. In particular, the control circuitry 175 may be configured to provide an adjustable voltage to a selected barrier gate line 104 while leaving other barrier gate lines 104 at a constant voltage, as suitable. The control circuitry 175 may also be configured to provide microwave pulses and DC voltage to each quantum dot gate line 102 separately, and hold DC voltages constant during operation, as suitable.

FIG. 6 illustrates an electrical configuration in which quantum dots are formed under quantum dot gates (indicated by the green circles), but no quantum dot interactions take place. In the configuration of FIG. 6, all of the quantum dot gate lines 102 may be supplied with voltages (indicated as Vtuned) in FIG. 6 that allow the quantum dot gates associated with different quantum dot gate lines 102 to be at essentially similar energy levels, and thus not likely to engage in quantum interaction across different quantum dot gate lines 102. Note that the particular voltage value corresponding to Vtuned for a particular quantum dot gate line 102 may be different from the particular voltage value corresponding to Vtuned for a different quantum dot gate line 102; however, the voltages on each of the quantum dot gate lines 102 may be set to a "tuned" value (that may differ between quantum dot gate lines 102) that limits or prevents quantum interaction between quantum dots forming under the different quantum dot gate lines 102. Similarly, the barrier gate lines 104 may be supplied with voltages (indicated as Voff) that may be sufficient to provide a high potential energy barrier between the quantum dot gates on either side of the barrier gate lines 104. Note that the particular voltage value corresponding to Voff for a particular barrier gate line 104 may be different than the particular voltage value corresponding to Voff for another barrier gate line 104; however, the voltages on each of the barrier gate lines 104 may be set to an "off" value (that may differ between barrier gate lines 104) that limits or prevents quantum interaction between quantum dots forming on either side of each barrier gate line 104. The sequence of voltages applied to the quantum dot and barrier gate lines 104 may allow each of the quantum dots to be occupied by a single electron, and, as noted above, the voltage Voff on the barrier gate lines 104 may be sufficient to provide a high potential energy barrier between nearest neighbor quantum dots and thereby limit or prevent quantum interaction.

Figure 10:
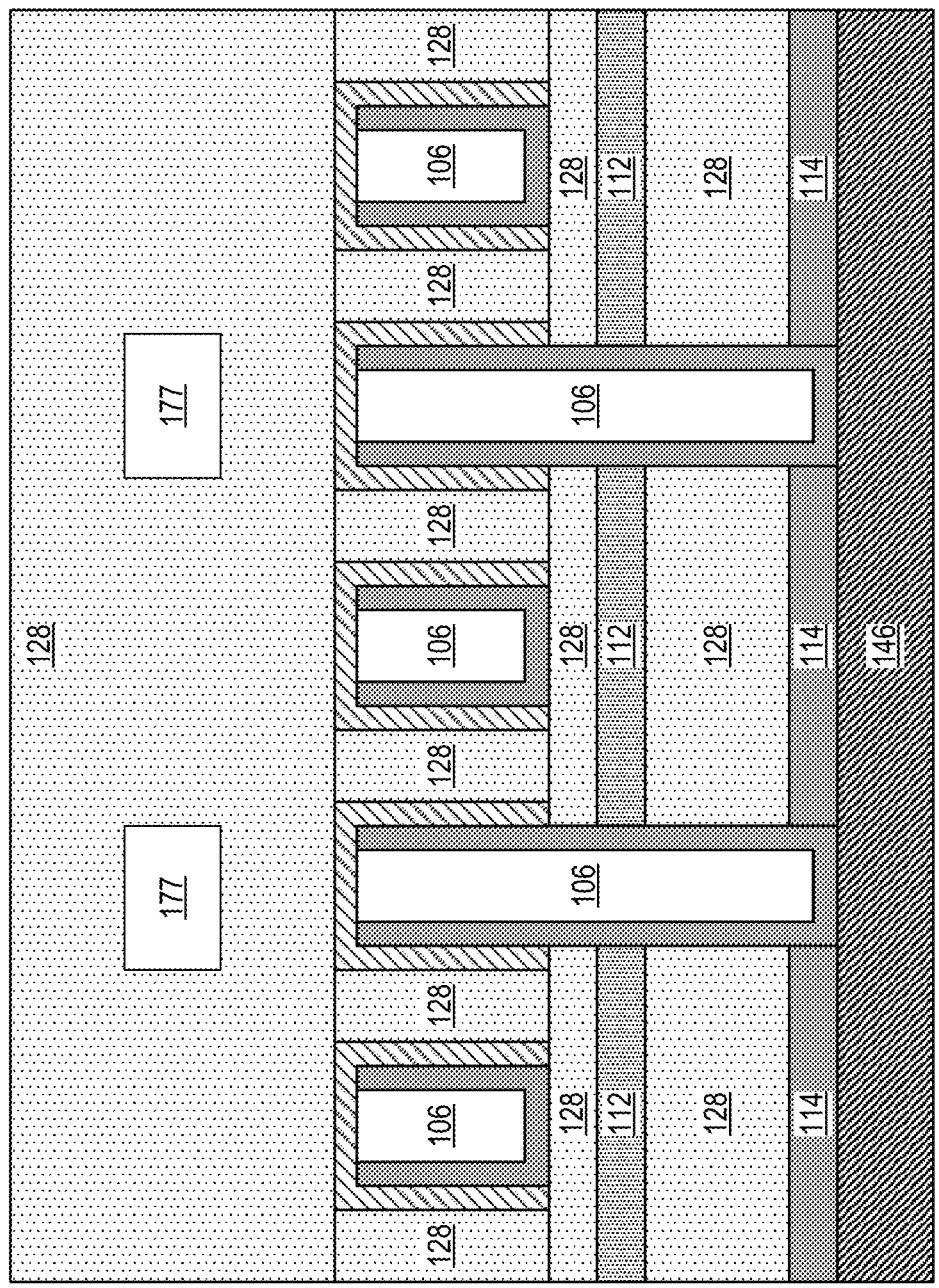
FIG. 10 illustrates an arrangement of magnets associated with quantum dot gates in a quantum dot device, in accordance with various embodiments.

FIG. 7 illustrates an electrical configuration that may implement a Pauli gate (or "NOT") operation on a particular quantum dot (identified in FIG. 7 by "π"). In some embodiments, the quantum dot device 100 may include a set of magnets 177 above the quantum dot gates such that the quantum dot gates are disposed between corresponding magnets 177 and the quantum well stack 146. The magnets 177 may be magnets, for example. FIG. 10 illustrates one example arrangement of magnets 177 in a quantum dot device 100, but any desired arrangement may be used. Each magnet 177 along a quantum dot gate line 102 may have a different associated frequency. This frequency may be engineered to take a particular value, or different magnets 177 may have different frequencies due to process variations. Any suitable magnets 177 may be used, and each magnet 177 may thus act as an "antenna" for directing energy of a matching frequency to the quantum dot associated with the magnet 177. To perform a Pauli gate operation, a microwave pulse (e.g., in the gigahertz range) may be applied to the quantum dot gate line 102 that includes the quantum dot gate associated with the quantum dot π. The frequency of the microwave pulse may allow the quantum dot π to be selected by the field gradient of the associated magnet 177, and thus the microwave pulse may change only the state of the quantum dot π (and not other quantum dots disposed below the same quantum dot gate line 102). The voltages on the other quantum dot gate lines 102 may remain fixed, and the voltages on the barrier gate lines 104 may also remain fixed to confine the Pauli gate operation to the quantum dot π.

FIG. 8 illustrates an electrical configuration that may implement an exchange gate operation on a pair of nearest neighbor ("diagonal") quantum dots (identified in FIG. 8 by "1" and "2"). An exchange gate may allow the quantum dots 1 and 2 to undergo a quantum interaction by appropriately adjusting the potential energy around them, as described below. The barrier gate line 104 that separates the quantum dots 1 and 2 may have its voltage adjusted to a value (Von) that lowers the potential energy barrier between the quantum dots 1 and 2 low enough for them to interact; other barrier gate lines 104 may maintain voltages (Voff) in which quantum dots separated by the associated barrier gates 160 do not interact (as discussed above with reference to FIG. 6). The voltage applied to the quantum dot gate line 102 associated with quantum dot 1 (labeled gate line "x") and the voltage applied to the quantum dot gate line 102 associated with quantum dot 2 (labeled gate line "x+1") may be made different from each other to provide some energy for their interaction. All of the quantum dot gate lines 102 on the same "side" as the quantum dot gate line 102 x (i.e., the quantum dot gate lines 102 0, . . . , x−1) may have mutually tuned voltages (which may differ between different quantum dot gate lines 102, as discussed above with reference to FIG. 6) that tunes these quantum dot gate lines 102 to the quantum dot gate line 102 x (in FIG. 8, indicated as Vtuned) so that quantum dots formed under different ones of these quantum dot gate lines 102 0, . . . , x may not interact. Similarly, all of the quantum dot gate lines 102 on the same "side" as the quantum dot gate line 102 x+1 (i.e., the quantum dot gate lines 102 x+2, . . . , x+n) may have mutually tuned voltages (which may differ between different quantum dot gate lines 102, as discussed above with reference to FIG. 6) that tunes these quantum dot gate lines 102 to the quantum dot gate line 102 x+1 (in FIG. 8, indicated as Vde-tuned) so that quantum dots formed under different ones of the quantum dot gate lines 102 x+1, . . . , x+n may not interact. In this manner, the interaction of quantum dots in the quantum dot device 100 of FIG. 8 may be limited to the interaction of quantum dots 1 and 2. Any pair of nearest neighbor quantum dots may be selectively allowed to interact using such a technique.

Figure 9:
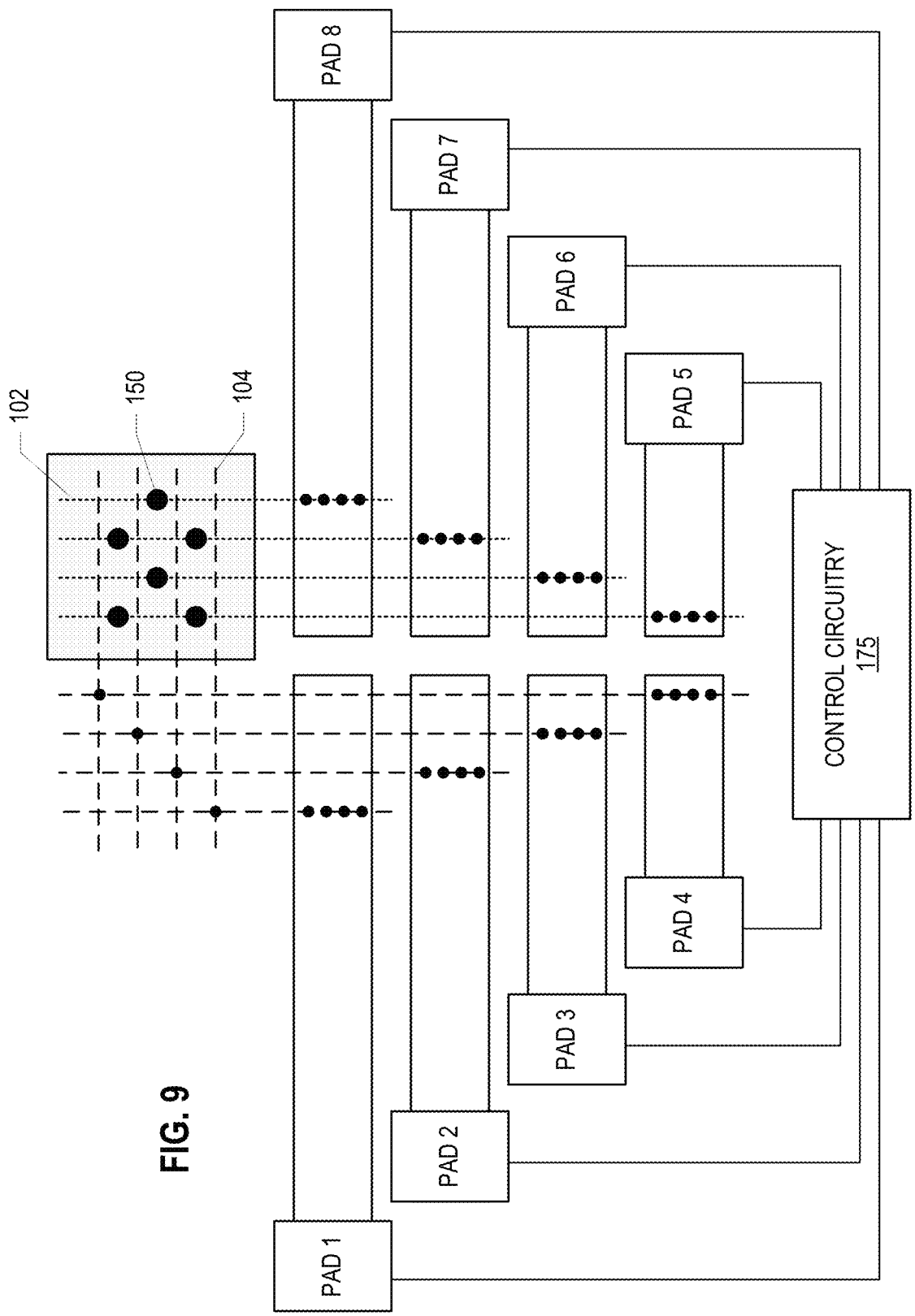
FIG. 9 illustrates an interconnect arrangement for a quantum dot device, in accordance with various embodiments.

FIG. 9 illustrates an interconnect arrangement for a quantum dot device 100, in accordance with various embodiments. The quantum dot device 100 schematically illustrated in FIG. 9 may take the form of any of the quantum dot devices 100 disclosed herein (e.g., those discussed above with reference to FIGS. 1-5), and interconnects may be made to the barrier gate lines 104 and the quantum dot gate lines 102 in any desired manner. In FIG. 9, each gate line may be routed out to a bond pad for connection to a processing device or other control device to control the voltages on the gate lines (e.g., to perform any of the operations discussed above with reference to FIGS. 6-8).

Figure 11:
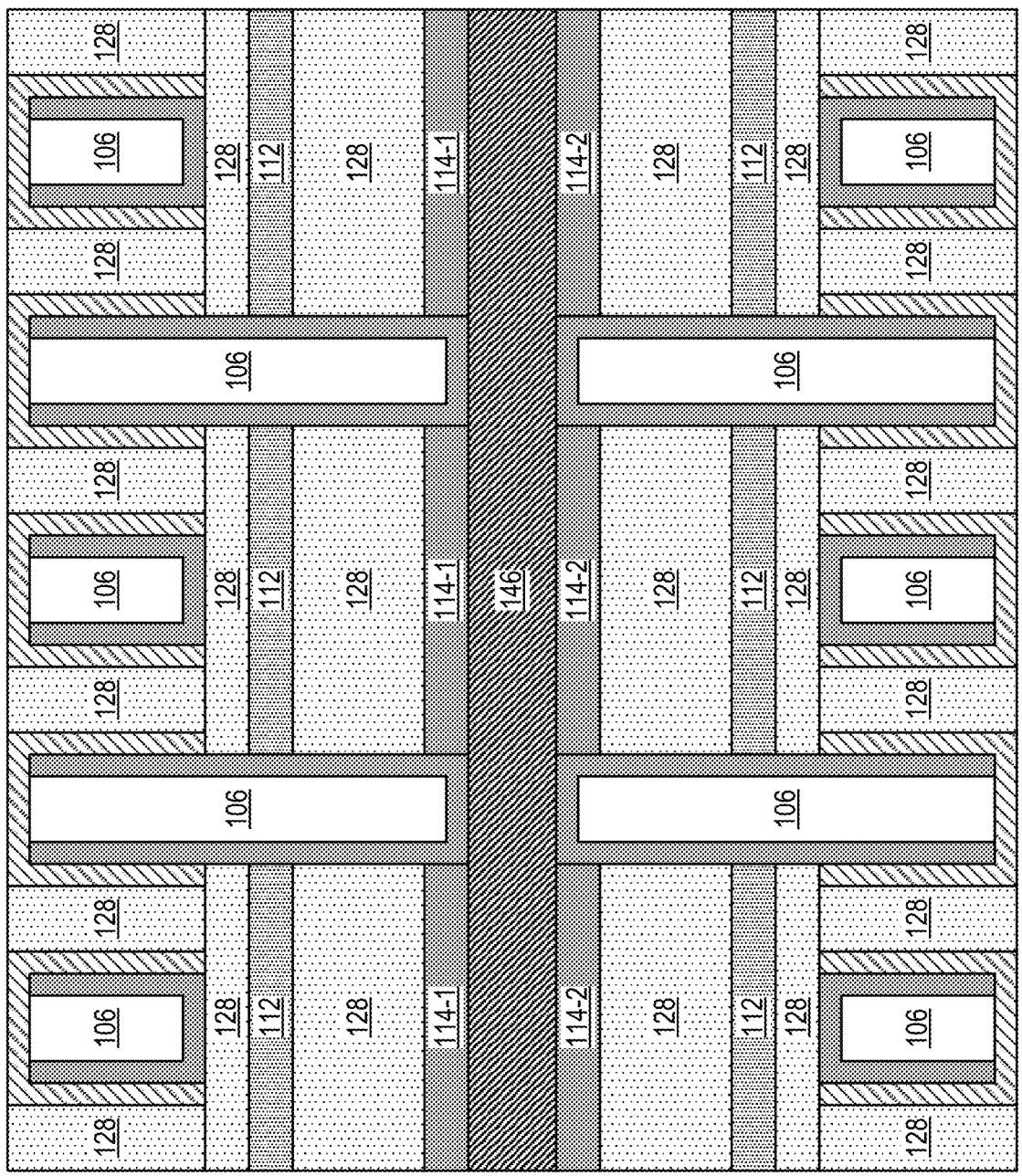
FIG. 11 illustrates a double-sided quantum dot device, in accordance with various embodiments.

FIG. 11 is a cross-sectional view of a double-sided quantum dot device 100, in accordance with various embodiments. The quantum dot device 100 of FIG. 11 may be formed by performing the operations discussed above with reference to FIG. 2, flipping the result over, and performing the same operations on the "other side" of the quantum well stack 146. The quantum well stack 146 may itself include two quantum well layers, one in which quantum dots may be formed by the gates on the corresponding side of the quantum well stack 146, and the other in which quantum dots may be formed by the gates on the other, corresponding side of the quantum well stack 146. In some embodiments, the quantum dots formed in one of the quantum well layers may act as the "active" quantum dots in the quantum dot device 100, and the quantum dots formed in the other of the quantum well layers may act as the "read" quantum dots, sensing the state of the active quantum dots for readout (e.g., through the corresponding gates and other interconnects).

FIGS. 12A-12E illustrate various examples of quantum well stacks 146 that may provide the quantum well stacks 146 of any of the embodiments of the quantum dot devices 100 disclosed herein. In some embodiments, the layers of the quantum well stacks 146 may be grown on a substrate (e.g., a silicon or germanium wafer) (and on each other) by epitaxy. Although the quantum well stacks 146 illustrated in FIG. 12 each include two quantum well layers 152 (e.g., as appropriate for a double-sided device, as discussed above with reference to FIG. 11), in some embodiments, the quantum well stack 146 included in a quantum dot device 100 may include one quantum well layer 152 or more than two quantum well layers 152; elements may be omitted from the quantum well stacks 146, or added to the quantum well stacks 146, discussed with reference to FIG. 12 to achieve such embodiments, as appropriate. Layers other than the quantum well layer(s) 152 in a quantum well stack 146 may have higher threshold voltages for conduction than the quantum well layer(s) 152 so that when the quantum well layer(s) 152 are biased at their threshold voltages, the quantum well layer(s) 152 conduct and the other layers of the quantum well stack 146 do not. This may avoid parallel conduction in both the quantum well layer(s) 152 and the other layers, and thus avoid compromising the strong mobility of the quantum well layer(s) 152 with conduction in layers having inferior mobility.

FIG. 12A is a cross-sectional view of a quantum well stack 146 including only a quantum well layer 152-1, a barrier layer 154, and a quantum well layer 152-2. In some embodiments, the quantum well layers 152 of FIG. 12A may be formed of intrinsic silicon, and the gate dielectrics 114 may be formed of silicon oxide; in such an arrangement, during use of the quantum dot device 100, a 2DEG may form in the intrinsic silicon at the interface between the intrinsic silicon and the proximate silicon oxide. Embodiments in which the quantum well layers 152 of FIG. 12A are formed of intrinsic silicon may be particularly advantageous for electron-type quantum dot devices 100. In some embodiments, the quantum well layers 152 of FIG. 12A may be formed of intrinsic germanium, and the gate dielectrics 114 may be formed of germanium oxide; in such an arrangement, during use of the quantum dot device 100, a 2DEG may form in the intrinsic germanium at the interface between the intrinsic germanium and the proximate germanium oxide. Such embodiments may be particularly advantageous for hole-type quantum dot devices 100. In some embodiments, the quantum well layers 152 may be strained, while in other embodiments, the quantum well layers 152 may not be strained.

The barrier layer 154 of FIG. 12A may provide a potential barrier between the quantum well layer 152-1 and the quantum well layer 152-2. In some embodiments in which the quantum well layers 152 of FIG. 12A are formed of silicon, the barrier layer 154 may be formed of silicon germanium. The germanium content of this silicon germanium may be 20-80% (e.g., 30%). In some embodiments in which the quantum well layers 152 are formed of germanium, the barrier layer 154 may be formed of silicon germanium (with a germanium content of 20-80% (e.g., 70%)).

The thicknesses (i.e., z-heights) of the layers in the quantum well stack 146 of FIG. 12A may take any suitable values. For example, in some embodiments, the thickness of the barrier layer 154 (e.g., silicon germanium) may be between 0 and 400 nanometers. In some embodiments, the thickness of the quantum well layers 152 (e.g., silicon or germanium) may be between 5 and 30 nanometers.

FIG. 12B is a cross-sectional view of a quantum well stack 146 including quantum well layers 152-1 and 152-2, a barrier layer 154-2 disposed between the quantum well layers 152-1 and 152-2, and additional barrier layers 154-1 and 154-3. In the quantum dot device 100, the barrier layer 154-1 may be disposed between the quantum well layer 152-1 and the gate dielectric 114-1 (see, e.g., FIG. 11). The barrier layer 154-3 may be disposed between the quantum well layer 152-2 and the gate dielectric 114-2 (see, e.g., FIG. 11). In some embodiments, the barrier layer 154-3 may be formed of a material (e.g., silicon germanium), and when the quantum well stack 146 is being grown on the substrate 144, the barrier layer 154-3 may include a buffer region of that material. This buffer region may trap defects that form in this material as it is grown on the substrate 144, and in some embodiments, the buffer region may be grown under different conditions (e.g., deposition temperature or growth rate) from the rest of the barrier layer 154-3. In particular, the rest of the barrier layer 154-3 may be grown under conditions that achieve fewer defects than the buffer region. In some embodiments, the buffer region may be lattice mismatched with the quantum well layer(s) 152 in a quantum well stack 146, imparting biaxial strain to the quantum well layer(s) 152.

The barrier layers 154-1 and 154-3 may provide potential energy barriers around the quantum well layers 152-1 and 152-2, respectively, and the barrier layer 154-1 may take the form of any of the embodiments of the barrier layer 154-3 discussed herein. In some embodiments, the barrier layer 154-1 may have a similar form as the barrier layer 154-3, but may not include a "buffer region" as discussed above; in the quantum dot device 100, the barrier layer 154-3 and the barrier layer 154-1 may have substantially the same structure. The barrier layer 154-2 may take the form of any of the embodiments of the barrier layer 154 discussed above with reference to FIG. 12A. The thicknesses (i.e., z-heights) of the layers in the quantum well stack 146 of FIG. 12B may take any suitable values. For example, in some embodiments, the thickness of the barrier layers 154-1 and 154-3 (e.g., silicon germanium) in the quantum dot device 100 may be between 0 and 400 nanometers. In some embodiments, the thickness of the quantum well layers 152 (e.g., silicon or germanium) may be between 5 and 30 nanometers (e.g., 10 nanometers). In some embodiments, the thickness of the barrier layer 154-2 (e.g., silicon germanium) may be between 25 and 75 nanometers (e.g., 32 nanometers).

FIGS. 12C-12D illustrate examples of quantum well stacks 146 including doped layer(s) 137. As noted above, doped layer(s) 137 may be included in a quantum well stack 146 instead of or in addition to an accumulation region 162.

FIG. 12C is a cross-sectional view of a quantum well stack 146 including a buffer layer 176, a barrier layer 155-2, a quantum well layer 152-2, a barrier layer 154-2, a doped layer 137, a barrier layer 154-1, a quantum well layer 152-1, and a barrier layer 155-1.

The buffer layer 176 may be formed of the same material as the barrier layer 155-2, and may be present to trap defects that form in this material as it is grown. In some embodiments, the buffer layer 176 may be grown under different conditions (e.g., deposition temperature or growth rate) from the barrier layer 155-2. In particular, the barrier layer 155-2 may be grown under conditions that achieve fewer defects than the buffer layer 176. In some embodiments in which the buffer layer 176 includes silicon germanium, the silicon germanium of the buffer layer 176 may have a germanium content that varies to the barrier layer 155-2; for example, the silicon germanium of the buffer layer 176 may have a germanium content that varies from zero percent to a nonzero percent (e.g., 30%) at the barrier layer 155-2. The buffer layer 176 may be grown beyond its critical layer thickness such that it is substantially free of stress from the underlying base (and thus may be referred to as "relaxed"). In some embodiments, the thickness of the buffer layer 176 (e.g., silicon germanium) may be between 0.3 and 4 microns (e.g., 0.3-2 microns, or 0.5 microns). In some embodiments, the buffer layer 176 may be lattice mismatched with the quantum well layer(s) 152 in a quantum well stack 146, imparting biaxial strain to the quantum well layer(s) 152.

The barrier layer 155-2 may provide a potential energy barrier proximate to the quantum well layer 152-2. The barrier layer 155-2 may be formed of any suitable materials. For example, in some embodiments in which the quantum well layer 152 is formed of silicon or germanium, the barrier layer 155-2 may be formed of silicon germanium. In some embodiments, the thickness of the barrier layer 155-2 may be between 0 and 400 nanometers (e.g., between 25 and 75 nanometers).

The quantum well layer 152-2 may be formed of a different material than the barrier layer 155-2. Generally, a quantum well layer 152 may be formed of a material such that, during operation of the quantum dot device 100, a 2DEG may form in the quantum well layer 152. Embodiments in which the quantum well layer 152 is formed of intrinsic silicon may be particularly advantageous for electron-type quantum dot devices 100. Embodiments in which a quantum well layer 152 is formed of intrinsic germanium may be particularly advantageous for hole-type quantum dot devices 100. In some embodiments, a quantum well layer 152 may be strained, while in other embodiments, a quantum well layer 152 may not be strained. The thickness of a quantum well layer 152 may take any suitable values; in some embodiments, a quantum well layer 152 may have a thickness between 5 and 30 nanometers.

In the quantum well stack 146 of FIG. 12C, the doped layer 137 may be "shared" by the two quantum well layers 152 in the quantum well stack 146, in that the doped layer 137 provides carriers to the quantum well layer 152-1 and the quantum well layer 152-2 during use. In the quantum dot device 100, the quantum well layer 152-1 may be disposed between the doped layer 137 and the gate dielectric 114-1, while the quantum well layer 152-2 may be disposed between the doped layer 137 and the gate dielectric 114-2. The doped layer 137 of FIG. 12C may be doped with an n-type material (e.g., for an electron-type quantum dot device 100) or a p-type material (e.g., for a hole-type quantum dot device 100). In some embodiments, the doping concentration of the doped layer 137 may be between $10^{17}/cm^3$ and $10^{20}/cm^3$ (e.g., between $10^{17}/cm^3$ and $10^{18}/cm^3$). The thickness (i.e., z-height) of the doped layer 137 may depend on the doping concentration, among other factors, and in some embodiments, may be between 5 and 50 nanometers (e.g., between 20 and 30 nanometers).

A doped layer 137 may be formed using any of a number of techniques. In some embodiments, a doped layer 137 may be formed of an undoped base material (e.g., silicon germanium) that is doped in situ during growth of the base material by epitaxy. In some embodiments, a doped layer 137 may initially be fully formed of an undoped base material (e.g., silicon germanium), then a layer of dopant may be deposited on this base material (e.g., a monolayer of the desired dopant), and an annealing process may be performed to drive the dopant into the base material. In some embodiments, a doped layer 137 may initially be fully formed of an undoped base material (e.g., silicon germanium), and the dopant may be implanted into the lattice (and, in some embodiments, may be subsequently annealed). In some embodiments, a doped layer 137 may be provided by a silicon germanium layer (e.g., with 90% germanium content) doped with an n-type dopant. In general, any suitable technique may be used to form a doped layer 137.

The barrier layer 154-2 may not be doped, and thus may provide a barrier to prevent impurities in the doped layer 137 from diffusing into the quantum well layer 152-2 and forming recombination sites or other defects that may reduce channel conduction and thereby impede performance of the quantum dot device 100. In some embodiments of the quantum well stack 146 of FIG. 12C, the doped layer 137 may include a same material as the barrier layer 154-2, but the barrier layer 154-2 may not be doped. For example, in some embodiments, the doped layer 137 and the barrier layer 154-2 may both be silicon germanium. In some embodiments in which the quantum well layer 152-2 is formed of silicon, the barrier layer 154-2 may be formed of silicon germanium. The germanium content of this silicon germanium may be 20-80% (e.g., 30%). In some embodiments in which the quantum well layer 152-2 is formed of germanium, the barrier layer 154-2 may be formed of silicon germanium (with a germanium content of 20-80% (e.g., 70%)). The thickness of the barrier layer 154-2 may depend on the doping concentration of the doped layer 137, among other factors discussed below, and in some embodiments, may be between 5 and 50 nanometers (e.g., between 20 and 30 nanometers).

The barrier layer 154-1 may provide a barrier to prevent impurities in the doped layer 137 from diffusing into the quantum well layer 152-1, and may take any of the forms described herein for the barrier layer 154-2. Similarly, the quantum well layer 152-1 may take any of the forms described herein for the quantum well layer 152-2. The barrier layer 155-1 may provide a potential energy barrier proximate to the quantum well layer 152-1 (as discussed above with reference to the barrier layer 155-2 and the quantum well layer 152-2), and may take any of the forms described herein for the barrier layer 155-2.

The thickness of a barrier layer 154 may impact the ease with which carriers in the doped layer 137 can move into a quantum well layer 152 disposed on the other side of the barrier layer 154. The thicker the barrier layer 154, the more difficult it may be for carriers to move into the quantum well layer 152; at the same time, the thicker the barrier layer 154, the more effective it may be at preventing impurities from the doped layer 137 from moving into the quantum well layer 152. Additionally, the diffusion of impurities may depend on the temperature at which the quantum dot device 100 operates. Thus, the thickness of the barrier layer 154 may be adjusted to achieve a desired energy barrier and impurity screening effect between the doped layer 137 and the quantum well layer 152 during expected operating conditions.

In some embodiments of the quantum well stack 146 of FIG. 12C (e.g., those included in "single-sided" quantum dot devices 100), only a single quantum well layer 152 may be included. For example, the layers 154-1 and 152-1 may be omitted, and gates may be formed proximate to the barrier layer 155-1 such that the quantum well layer 152-1 is disposed between the gates and the doped layer 137. In other embodiments, the layers 154-1, 152-1, and 155-2 may be omitted, and gates may be formed proximate to the doped layer 137. In some embodiments, the buffer layer 176 and/or the barrier layer 155-2 may be omitted from the quantum well stack 146 of FIG. 12C.

FIG. 12D is a cross-sectional view of a quantum well stack 146 that is similar to the quantum well stack 146 of FIG. 12C, except that in the place of the single doped layer 137 shared by two quantum well layers 152, the quantum well stack 146 of FIG. 12D includes two different doped layers 137-2 and 137-1 (spaced apart by a barrier layer 155-3). In such an embodiment, the doped layer 137-2 may provide a source of carriers for the quantum well layer 152-2, and the doped layer 137-1 may provide a source of carriers for the quantum well layer 152-1. The barrier layer 155-3 may provide a potential barrier between the two doped layers 137, and may take any suitable form. Generally, the elements of the quantum well stack 146 of FIG. 12D may take the form of any of the corresponding elements of the quantum well stack 146 of FIG. 12C. The doped layers 137-1 and 137-2 may have the same geometry and material composition, or may have different geometries and/or material compositions.

FIG. 12E is a cross-sectional view of a quantum well stack 146 in which two doped layers 137-1 and 137-2 are disposed toward the "outside" of the quantum well stack 146, rather than the "inside" of the quantum well stack 146, as illustrated in FIGS. 12C and 12D. In particular, the quantum well layer 152-2 is disposed between the doped layer 137-2 and the quantum well layer 152-1, and the quantum well layer 152-1 is disposed between the doped layer 137-1 and the quantum well layer 152-2. In the quantum dot device 100, the doped layer 137-1 may be disposed between the quantum well layer 152-1 and the gate dielectric 114-1, while the doped layer 137-2 may be disposed between the quantum well layer 152-2 and the gate dielectric 114-2. In the quantum well stack 146 of FIG. 12E, a barrier layer 155-3 provides a potential barrier between the quantum well layers 152-1 and 152-2 (rather than between the doped layers 137-1 and 137-2, as illustrated in the quantum well stack 146 of FIG. 12D). Generally, the elements of the quantum well stack 146 of FIG. 12E may take the form of any of the corresponding elements of the quantum well stack 146 of FIGS. 12A-D.

In some particular embodiments in which the quantum dot device 100 is a "single-sided" device with only one set of gates, the quantum well stack 146 may include a silicon base, a buffer layer 176 of silicon germanium (e.g., with 30% germanium content), then a doped layer 137 formed of silicon germanium doped with an n-type dopant, a thin barrier layer 154 formed of silicon germanium (e.g., silicon germanium with 70% germanium content), a silicon quantum well layer 152, and a barrier layer 155 formed of silicon germanium (e.g., with 30% germanium content); in such an embodiment, the gates may be disposed on the barrier layer 155. In some other particular embodiments in which the quantum dot device 100 is a "single-sided" device with only one set of gates, the quantum well stack 146 may include a silicon base, a doped layer 137 formed of silicon doped with an n-type dopant, a thin barrier layer 154 formed of silicon germanium, and a silicon quantum well layer 152; in such an embodiment, the gates may be disposed on the silicon quantum well layer 152.

FIGS. 13A-B are top views of a wafer 450 and dies 452 that may be formed from the wafer 450; the dies 452 may include any of the quantum dot devices 100 disclosed herein. The wafer 450 may include semiconductor material and may include one or more dies 452 having conventional and quantum dot device elements formed on a surface of the wafer 450. Each of the dies 452 may be a repeating unit of a semiconductor product that includes any suitable conventional and/or quantum dot device. After the fabrication of the semiconductor product is complete, the wafer 450 may undergo a singulation process in which each of the dies 452 is separated from one another to provide discrete "chips" of the semiconductor product. A die 452 may include one or more quantum dot devices 100 and/or supporting circuitry to route electrical signals to the quantum dot devices (e.g., interconnects including conductive vias and lines, or any control circuitry 175, as discussed above with reference to FIG. 9), as well as any other IC components. In some embodiments, the wafer 450 or the die 452 may include a memory device (e.g., a static random access memory (SRAM) device), a logic device (e.g., AND, OR, NAND, or NOR gate), or any other suitable circuit element. Multiple ones of these devices may be combined on a single die 452. For example, a memory array formed by multiple memory devices may be formed on a same die 452 as a processing device (e.g., the processing device 2002 of FIG. 15) or other logic that is configured to store information in the memory devices or execute instructions stored in the memory array.

FIG. 14 is a cross-sectional side view of a device assembly 400 that may include any of the embodiments of the quantum dot devices 100 disclosed herein. The device assembly 400 includes a number of components disposed on a circuit board 402. The device assembly 400 may include components disposed on a first face 440 of the circuit board 402 and an opposing second face 442 of the circuit board 402; generally, components may be disposed on one or both faces 440 and 442.

In some embodiments, the circuit board 402 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 402. In other embodiments, the circuit board 402 may be a package substrate or flexible board.

The device assembly 400 illustrated in FIG. 14 includes a package-on-interposer structure 436 coupled to the first face 440 of the circuit board 402 by coupling components 416. The coupling components 416 may electrically and mechanically couple the package-on-interposer structure 436 to the circuit board 402, and may include solder balls (as shown in FIG. 14), male and female portions of a socket, an adhesive, an underfill material, and/or any other suitable electrical and/or mechanical coupling structure.

The package-on-interposer structure 436 may include a package 420 coupled to an interposer 404 by coupling components 418. The coupling components 418 may take any suitable form for the application, such as the forms discussed above with reference to the coupling components 416. Although a single package 420 is shown in FIG. 14, multiple packages may be coupled to the interposer 404; indeed, additional interposers may be coupled to the interposer 404. The interposer 404 may provide an intervening substrate used to bridge the circuit board 402 and the package 420. The package 420 may be a quantum dot device package (e.g., a package that includes one or more quantum dot devices 100) or may be a conventional IC package, for example. In some embodiments, the package 420 may include a quantum dot device die (e.g., a die that includes one or more quantum dot devices 100) coupled to a package substrate (e.g., by flip chip connections). Generally, the interposer 404 may spread a connection to a wider pitch or reroute a connection to a different connection. For example, the interposer 404 may couple the package 420 (e.g., a die) to a ball grid array (BGA) of the coupling components 416 for coupling to the circuit board 402. In the embodiment illustrated in FIG. 14, the package 420 and the circuit board 402 are attached to opposing sides of the interposer 404; in other embodiments, the package 420 and the circuit board 402 may be attached to a same side of the interposer 404. In some embodiments, three or more components may be interconnected by way of the interposer 404.

The interposer 404 may be formed of an epoxy resin, a fiberglass-reinforced epoxy resin, a ceramic material, or a polymer material such as polyimide. In some embodiments, the interposer 404 may be formed of alternate rigid or flexible materials that may include the same materials described above for use in a semiconductor substrate, such as silicon, germanium, and other group III-V and group IV materials. The interposer 404 may include metal interconnects 408 and vias 410, including but not limited to through-silicon vias (TSVs) 406. The interposer 404 may further include embedded devices 414, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 404. The package-on-interposer structure 436 may take the form of any of the package-on-interposer structures known in the art.

The device assembly 400 may include a package 424 coupled to the first face 440 of the circuit board 402 by coupling components 422. The coupling components 422 may take the form of any of the embodiments discussed above with reference to the coupling components 416, and the package 424 may take the form of any of the embodiments discussed above with reference to the package 420. The package 424 may be a quantum dot device package (e.g., a package that includes one or more quantum dot devices 100) or may be a conventional IC package, for example. In some embodiments, the package 424 may include a quantum dot device die (e.g., a die that includes one or more quantum dot devices 100) coupled to a package substrate (e.g., by flip chip connections).

The device assembly 400 illustrated in FIG. 14 includes a package-on-package structure 434 coupled to the second face 442 of the circuit board 402 by coupling components 428. The package-on-package structure 434 may include a package 426 and a package 432 coupled together by coupling components 430 such that the package 426 is disposed between the circuit board 402 and the package 432. The coupling components 428 and 430 may take the form of any of the embodiments of the coupling components 416 discussed above, and the packages 426 and 432 may take the form of any of the embodiments of the package 420 discussed above. Each of the packages 426 and 432 may be a quantum dot device package (e.g., a package that includes one or more quantum dot devices 100) or may be a conventional IC package, for example. In some embodiments, one or both of the packages 426 and 432 may take the form of any of the embodiments of a quantum dot device package (e.g., a package that includes one or more quantum dot devices 100) disclosed herein, and may include a die coupled to a package substrate (e.g., by flip chip connections).

Figure 15:
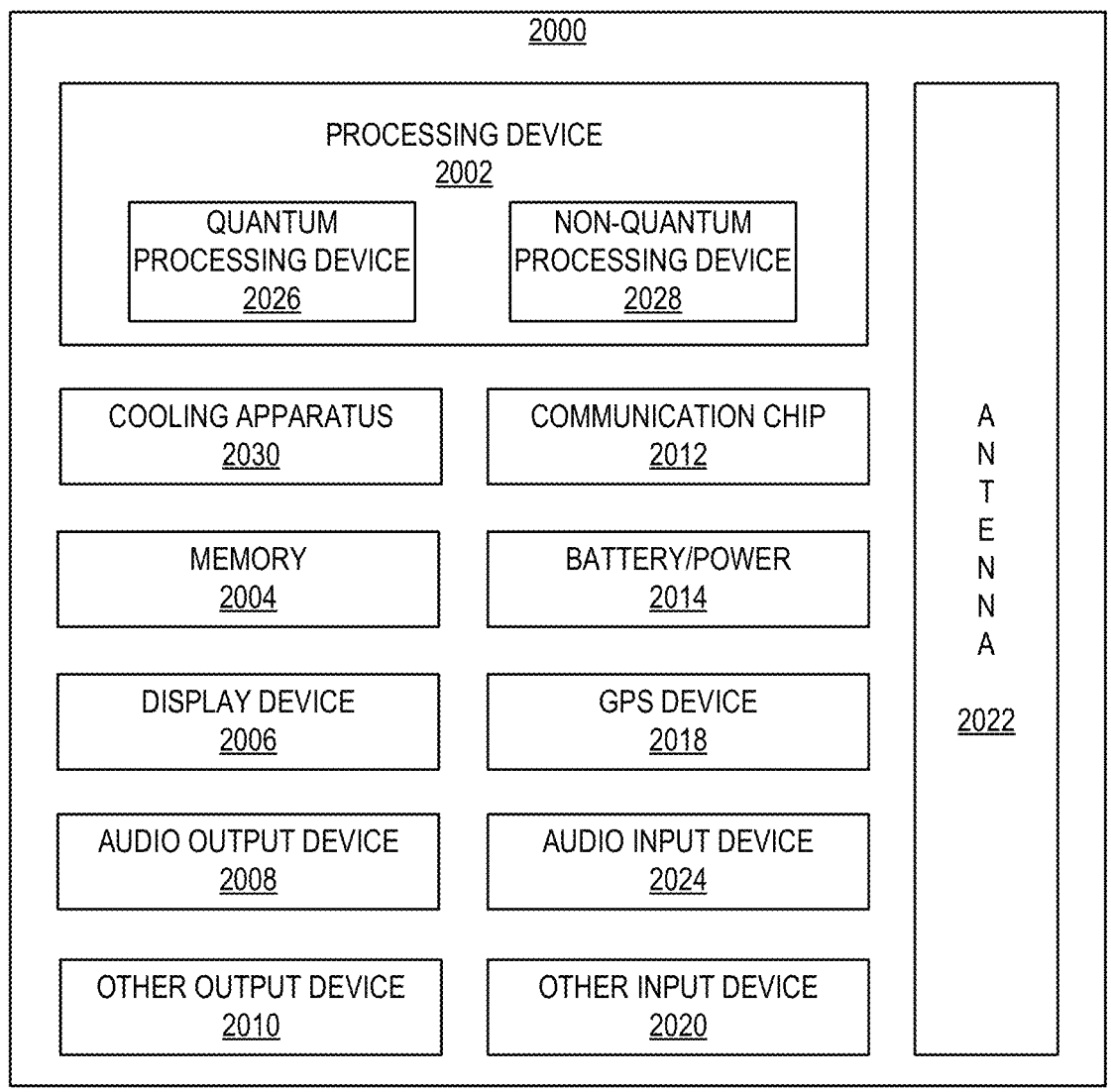
FIG. 15 is a block diagram of an example quantum computing device that may include any of the quantum dot devices disclosed herein, in accordance with various embodiments.

FIG. 15 is a block diagram of an example quantum computing device 2000 that may include any of the quantum dot devices 100 disclosed herein. A number of components are illustrated in FIG. 15 as included in the quantum computing device 2000, but any one or more of these components may be omitted or duplicated, as suitable for the application. In some embodiments, some or all of the components included in the quantum computing device 2000 may be attached to one or more printed circuit boards (e.g., a motherboard). In some embodiments, various ones of these components may be fabricated onto a single system-on-a-chip (SoC) die. Additionally, in various embodiments, the quantum computing device 2000 may not include one or more of the components illustrated in FIG. 15, but the quantum computing device 2000 may include interface circuitry for coupling to the one or more components. For example, the quantum computing device 2000 may not include a display device 2006, but may include display device interface circuitry (e.g., a connector and driver circuitry) to which a display device 2006 may be coupled. In another set of examples, the quantum computing device 2000 may not include an audio input device 2024 or an audio output device 2008, but may include audio input or output device interface circuitry (e.g., connectors and supporting circuitry) to which an audio input device 2024 or audio output device 2008 may be coupled.

The quantum computing device 2000 may include a processing device 2002 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2002 may include a quantum processing device 2026 (e.g., one or more quantum processing devices), and a non-quantum processing device 2028 (e.g., one or more non-quantum processing devices). The quantum processing device 2026 may include one or more of the quantum dot devices 100 disclosed herein, and may perform data processing by performing operations on the quantum dots that may be generated in the quantum dot devices 100, and monitoring the result of those operations. For example, as discussed above, different quantum dots may be allowed to interact, the quantum states of different quantum dots may be set or transformed, and the quantum states of quantum dots may be read (e.g., by another quantum dot). The quantum processing device 2026 may be a universal quantum processor, or specialized quantum processor configured to run one or more particular quantum algorithms. In some embodiments, the quantum processing device 2026 may execute algorithms that are particularly suitable for quantum computers, such as cryptographic algorithms that utilize prime factorization, encryption/decryption, algorithms to optimize chemical reactions, algorithms to model protein folding, etc. The quantum processing device 2026 may also include support circuitry to support the processing capability of the quantum processing device 2026, such as input/output channels, multiplexers, signal mixers, quantum amplifiers, and analog-to-digital converters.

As noted above, the processing device 2002 may include a non-quantum processing device 2028. In some embodiments, the non-quantum processing device 2028 may provide peripheral logic to support the operation of the quantum processing device 2026. For example, the non-quantum processing device 2028 may control the performance of a read operation, control the performance of a write operation, control the clearing of quantum bits, control the performance of any of the operations discussed above with reference to FIGS. 6-8, etc. The non-quantum processing device 2028 may also perform conventional computing functions to supplement the computing functions provided by the quantum processing device 2026. For example, the non-quantum processing device 2028 may interface with one or more of the other components of the quantum computing device 2000 (e.g., the communication chip 2012 discussed below, the display device 2006 discussed below, etc.) in a conventional manner, and may serve as an interface between the quantum processing device 2026 and conventional components. The non-quantum processing device 2028 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices.

The quantum computing device 2000 may include a memory 2004, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the states of qubits in the quantum processing device 2026 may be read and stored in the memory 2004. In some embodiments, the memory 2004 may include memory that shares a die with the non-quantum processing device 2028. This memory may be used as cache memory and may include embedded dynamic random access memory (eDRAM) or spin transfer torque magnetic random-access memory (STT-MRAM).

The quantum computing device 2000 may include a cooling apparatus 2030. The cooling apparatus 2030 may maintain the quantum processing device 2026 at a predetermined low temperature during operation to reduce the effects of scattering in the quantum processing device 2026. This predetermined low temperature may vary depending on the setting; in some embodiments, the temperature may be 5 degrees Kelvin or less. In some embodiments, the non-quantum processing device 2028 (and various other components of the quantum computing device 2000) may not be cooled by the cooling apparatus 2030, and may instead operate at room temperature. The cooling apparatus 2030 may be, for example, a dilution refrigerator, a helium-3 refrigerator, or a liquid helium refrigerator.

In some embodiments, the quantum computing device 2000 may include a communication chip 2012 (e.g., one or more communication chips). For example, the communication chip 2012 may be configured for managing wireless communications for the transfer of data to and from the quantum computing device 2000. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2012 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2012 may operate in accordance with other wireless protocols in other embodiments. The quantum computing device 2000 may include an antenna 2022 to facilitate wireless communications and/or to receive other wireless communications (such as AM or FM radio transmissions).

In some embodiments, the communication chip 2012 may manage wired communications, such as electrical, optical, or any other suitable communication protocols (e.g., the Ethernet). As noted above, the communication chip 2012 may include multiple communication chips. For instance, a first communication chip 2012 may be dedicated to shorter-range wireless communications such as Wi-Fi or Bluetooth, and a second communication chip 2012 may be dedicated to longer-range wireless communications such as GPS, EDGE, GPRS, CDMA, WiMAX, LTE, EV-DO, or others. In some embodiments, a first communication chip 2012 may be dedicated to wireless communications, and a second communication chip 2012 may be dedicated to wired communications.

The quantum computing device 2000 may include battery/power circuitry 2014. The battery/power circuitry 2014 may include one or more energy storage devices (e.g., batteries or capacitors) and/or circuitry for coupling components of the quantum computing device 2000 to an energy source separate from the quantum computing device 2000 (e.g., AC line power).

The quantum computing device 2000 may include a display device 2006 (or corresponding interface circuitry, as discussed above). The display device 2006 may include any visual indicators, such as a heads-up display, a computer monitor, a projector, a touchscreen display, a liquid crystal display (LCD), a light-emitting diode display, or a flat panel display, for example.

The quantum computing device 2000 may include an audio output device 2008 (or corresponding interface circuitry, as discussed above). The audio output device 2008 may include any device that generates an audible indicator, such as speakers, headsets, or earbuds, for example.

The quantum computing device 2000 may include an audio input device 2024 (or corresponding interface circuitry, as discussed above). The audio input device 2024 may include any device that generates a signal representative of a sound, such as microphones, microphone arrays, or digital instruments (e.g., instruments having a musical instrument digital interface (MIDI) output).

The quantum computing device 2000 may include a global positioning system (GPS) device 2018 (or corresponding interface circuitry, as discussed above). The GPS device 2018 may be in communication with a satellite-based system and may receive a location of the quantum computing device 2000, as known in the art.

The quantum computing device 2000 may include an other output device 2010 (or corresponding interface circuitry, as discussed above). Examples of the other output device 2010 may include an audio codec, a video codec, a printer, a wired or wireless transmitter for providing information to other devices, or an additional storage device.

The quantum computing device 2000 may include an other input device 2020 (or corresponding interface circuitry, as discussed above). Examples of the other input device 2020 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The quantum computing device 2000, or a subset of its components, may have any appropriate form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

Any suitable materials may be used in various ones of the embodiments disclosed herein. For example, in some embodiments, the gate dielectric 114 may be a multilayer gate dielectric. The gate dielectric 114 may be, for example, silicon oxide, aluminum oxide, or a high-k dielectric, such as hafnium oxide. More generally, the gate dielectric 114 may include elements such as hafnium, silicon, oxygen, titanium, tantalum, lanthanum, aluminum, zirconium, barium, strontium, yttrium, lead, scandium, niobium, and zinc. Examples of materials that may be used in the gate dielectric 114 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric 114 to improve the quality of the gate dielectric 114.

In some embodiments, any of the gate metals (e.g., the barrier gate metal 108 and/or the quantum dot gate metal 106) may be a superconductor, such as aluminum, titanium nitride (e.g., deposited via atomic layer deposition), or niobium titanium nitride. The spacer materials (e.g., the spacer material 118, 134, or 140) may be any suitable material, such as a carbon-doped oxide, silicon nitride, silicon oxide, or other carbides or nitrides (e.g., silicon carbide, silicon nitride doped with carbon, and silicon oxynitride). The insulating materials 128 may include silicon oxide, silicon nitride, aluminum oxide, carbon-doped oxide, and/or silicon oxynitride, for example. Hardmasks (e.g., the hardmasks 110 and 112) may be formed of silicon nitride, silicon carbide, or another suitable material.

The following paragraphs provide examples of various ones of the embodiments disclosed herein.

Example A1 is a quantum dot device, including: a quantum well stack; a plurality of first gates above the quantum well stack; and a plurality of second gates above the quantum well stack; wherein a first gate is between each nearest neighbor pair of second gates.

Example A2 is a quantum dot device, including: a quantum well stack; a plurality of first gates above the quantum well stack; and a plurality of second gates above the quantum well stack; wherein the plurality of first gates are arranged in electrically continuous rows extending in a first direction, and the plurality of second gates are arranged in electrically continuous rows extending in a second direction perpendicular to the first direction.

Example A3 is a quantum dot device, including: a quantum well stack; a plurality of first gates above the quantum well stack; and a plurality of second gates above the quantum well stack; wherein the plurality of second gates are arranged as points in a grid, and diagonal subsets of the plurality of second gates with respect to the grid are electrically continuous.

Example A4 may include the subject matter of any of Examples A1-3, and may further specify that an individual first gate includes a first gate metal that extends between multiple nearest neighbor pairs of the second gates.

Example A5 may include the subject matter of any of Examples A1-4, and may further specify that an insulating material is disposed between a first one of the first gates and a second one of the first gates adjacent to the first one of the first gates.

Example A6 may include the subject matter of Example A5, and may further specify that at least one second gate is disposed between the first one of the first gates and a third one of the first gates adjacent to the first one of the first gates such that the first one of the first gates is between the second one of the first gates and the third one of the first gates.

Example A7 may include the subject matter of any of Examples A1-6, and may further include a hardmask above gate metal of the first gates.

Example A8 may include the subject matter of any of Examples A1-7, and may further include multiple hardmasks above gate metal of the first gates.

Example A9 may include the subject matter of Example A8, and may further include an insulating material between at least two of the hardmasks.

Example A10 may include the subject matter of any of Examples A7-9, and may further include an insulating material on the hardmask such that the insulating material is between the hardmask and gate metal of the second gates.

Example A11 may include the subject matter of any of Examples A1-10, and may further include insulating material between gate metal of the first gates and gate metal of the second gates such that the gate metal of the first gates is between the insulating material and the quantum well stack.

Example A12 may include the subject matter of any of Examples A1-11, and may further include spacer material between gate metal of the first gates and gate metal of the second gates.

Example A13 may include the subject matter of any of Examples A1-12, and may further include second gate metal stubs alternatingly arranged with second gates.

Example A14 may include the subject matter of any of Examples A1-13, and may further include spacer material disposed above gate metal of the second gates.

Example A15 may include the subject matter of any of Examples A1-14, and may further include a gate dielectric between gate metal of the first gates and the quantum well stack.

Example A16 may include the subject matter of Example A15, and may further specify that the gate dielectric continuously extends between gate metal of the second gates and the quantum well stack.

Example A17 may include the subject matter of any of Examples A1-16, and may further specify that the first gates are dimensioned and positioned in accordance with a pitch halving technique.

Example A18 may include the subject matter of any of Examples A1-17, and may further specify that the second gates are dimensioned and positioned in accordance with a pitch halving technique.

Example A19 may include the subject matter of any of Examples A1-18, and may further include a multiplexer coupled to the first gates.

Example A20 may include the subject matter of Example A19, and may further specify that the multiplexer is a first multiplexer, and the quantum dot device further includes a multiplexer coupled to the second gates.

Example A21 may include the subject matter of any of Examples A1-20, and may further specify that the first gates have a pitch between 40 nanometers and 100 nanometers.

Example A22 may include the subject matter of any of Examples A1-21, and may further specify that the second gates have a pitch that is different from a pitch of the first gates.

Example A23 may include the subject matter of any of Examples A1-21, and may further specify that a pair of nearest neighbor second gates has a pitch between 60 nanometers and 100 nanometers.

Example A24 may include the subject matter of any of Examples A1-23, and may further include a plurality of parallel first gate lines extending away from the plurality of first gates.

Example A25 may include the subject matter of Example A24, and may further include a plurality of parallel second gate lines extending away from the plurality of second gates in a direction perpendicular to the first gate lines.

Example A26 may include the subject matter of any of Examples A1-25, and may further include a plurality of magnets disposed above the plurality of second gates.

Example A27 may include the subject matter of any of Examples A1-26, and may further specify that the first gates are barrier gates and the second gates are quantum dot gates.

Example B1 is a method of performing a Pauli gate operation with the quantum dot device of Example A27, including: applying voltages to the barrier gates and the quantum dot gates to form a quantum dot in the quantum well stack under a first quantum dot gate; and applying a microwave pulse to multiple quantum dot gates arranged in an electrically continuous row, wherein the multiple quantum dot gates include the first quantum dot gate, and wherein the microwave pulse is tuned to a frequency of a magnet disposed above the first quantum dot gate to perform a Pauli gate operation on the quantum dot.

Example B2 may include the subject matter of Example B1, and may further specify that voltages on the barrier gates are held constant while the microwave pulse is applied to the multiple quantum dot gates.

Example B3 may include the subject matter of any of Examples B1-2, and may further specify that voltages on other quantum dot gates are held constant while the microwave pulse is applied to the multiple quantum dot gates.

Example B4 may include the subject matter of any of Examples B1-3, and may further specify that the quantum dot is an electron spin quantum dot.

Example C1 is a method of performing an exchange gate operation with the quantum dot device of Example A27, including: applying voltages to the barrier gates and the quantum dot gates to form a first quantum dot in the quantum well stack under a first quantum dot gate and to form a second quantum dot in the quantum well stack under a second quantum dot gate, wherein the first quantum dot gate is included in a first plurality of quantum dot gates that are arranged in an electrically continuous row, the second quantum dot gate is included in a second plurality of quantum dot gates that are arranged in an electrically continuous row, and a first barrier gate is disposed between the first quantum dot gate and the second quantum dot gate; providing off voltages to the plurality of barrier gates; applying a first set of mutually tuning voltages to the first plurality of quantum dot gates and to first additional pluralities of quantum dot gates arranged in additional electrically continuous rows to one side of the first plurality of quantum dot gate in a first direction; applying a second set of mutually tuning voltages to the second plurality of quantum dot gate and to second additional pluralities of quantum dot gates arranged in additional electrically continuous rows to one side of the second plurality of quantum dot gates in a second direction opposite to the first direction, wherein the first plurality of quantum dot gates and the second plurality of quantum dot gates are detuned; and lowering the energy barrier on the first barrier gate relative to the other barrier gates to allow the first and second quantum dots to interact.

Example C2 may include the subject matter of Example C1, and may further specify that lowering the energy barrier includes increasing the voltage on the first barrier gate.

Example D1 is a method of manufacturing a quantum dot device, including: providing a plurality of first gate metal rows above a quantum well stack, wherein individual ones of the plurality of first gate metal rows are oriented in a first direction; providing an insulating material above the plurality of first gate metal rows; and providing a plurality of second gate metal rows above the insulating material, wherein individual ones of the plurality of second gate metal rows are oriented in a second direction perpendicular to the first direction, and the second gate metal extends down between at least some adjacent pairs of first gate metal rows.

Example D2 may include the subject matter of Example D1, and may further specify that the plurality of first gate metal rows are provided on a layer of gate dielectric on the quantum well stack.

Example D3 may include the subject matter of Example D2, and may further specify that the second gate metal extends down between at least some adjacent pairs of first gate metal rows to contact the gate dielectric.

Example D4 may include the subject matter of any of Examples D1-3, and may further specify that providing the plurality of first gate metal rows includes patterning the first gate metal rows by pitch halving.

Example D5 may include the subject matter of any of Examples D1-4, and may further specify that providing the plurality of second gate metal rows includes patterning the second gate metal rows by pitch halving.

Example D6 may include the subject matter of any of Examples D1-5, and may further specify that the insulating material includes a hardmask.

Example D7 may include the subject matter of any of Examples D1-6, and may further specify that the insulating material includes an interlayer dielectric.

Example D8 may include the subject matter of any of Examples D1-7, and may further include providing spacer material on side faces of the first gate metal rows.

Example D9 may include the subject matter of any of Examples D1-8, and may further include providing spacer material on side faces of the second gate metal rows.

Example E1 is a quantum computing device, including: a quantum processing device, wherein the quantum processing device includes the quantum dot device of any of Examples A1-27; a non-quantum processing device, coupled to the quantum processing device, to control electrical signals applied to the first and second gates; and a memory device to store data generated during operation of the quantum processing device.

Example E2 may include the subject matter of Example E1, and may further include a cooling apparatus to maintain the temperature of the quantum processing device below 5 degrees Kelvin.

Example E3 may include the subject matter of Example E2, and may further specify that the cooling apparatus includes a dilution refrigerator.

Example E4 may include the subject matter of Example E2, and may further specify that the cooling apparatus includes a liquid helium refrigerator.

Example E5 may include the subject matter of any of Examples E1-4, and may further specify that the memory device is to store instructions for a quantum computing algorithm to be executed by the quantum processing device.

The invention claimed is:

1. A quantum dot device, comprising:
   a quantum well stack;
   a plurality of first gates above the quantum well stack, wherein the first gates are distributed in a two-dimensional regular arrangement; and
   a plurality of second gates above the quantum well stack, wherein the second gates are distributed in a two-dimensional regular arrangement;
   wherein a first gate of the plurality of first gates is between each nearest neighbor pair of second gates of the plurality of second gates.

2. The quantum dot device of claim 1, wherein an individual first gate includes a first gate metal that extends between multiple nearest neighbor pairs of the second gates.

3. The quantum dot device of claim 1, wherein an insulating material is disposed between a first one of the first gates and a second one of the first gates adjacent to the first one of the first gates.

4. The quantum dot device of claim 3, wherein at least one second gate is disposed between the first one of the first gates and a third one of the first gates adjacent to the first one of the first gates such that the first one of the first gates is between the second one of the first gates and the third one of the first gates.

5. The quantum dot device of claim 1, further comprising:
   a hardmask above gate metal of the first gates.

6. The quantum dot device of claim 1, further comprising:
   multiple hardmasks above gate metal of the first gates.

7. The quantum dot device of claim 1, further comprising:
   insulating material between gate metal of the first gates and gate metal of the second gates such that the gate metal of the first gates is between the insulating material and the quantum well stack.

8. The quantum dot device of claim 1, further comprising:
   spacer material between gate metal of the first gates and gate metal of the second gates.

9. The quantum dot device of claim 1, further comprising:
   second gate metal stubs alternatingly arranged with the second gates.

10. The quantum dot device of claim 1, further comprising:
    spacer material disposed above gate metal of the second gates.

11. The quantum dot device of claim 1, further comprising:
    a gate dielectric between gate metal of the first gates and the quantum well stack.

12. The quantum dot device of claim 11, wherein the gate dielectric continuously extends between gate metal of the second gates and the quantum well stack.

13. The quantum dot device of claim 1, further comprising:
    a multiplexer coupled to the first gates.

14. The quantum dot device of claim 1, wherein the first gates have a pitch between 40 nanometers and 100 nanometers.

15. The quantum dot device of claim 1, further comprising:
    a plurality of parallel first gate lines extending away from the plurality of first gates.

16. The quantum dot device of claim 15, further comprising:
    a plurality of parallel second gate lines extending away from the plurality of second gates in a direction perpendicular to the first gate lines.

17. The quantum dot device of claim 1, further comprising:
    a plurality of magnets disposed above the plurality of second gates.

18. A quantum computing device, comprising:
    a quantum processing device, wherein the quantum processing device includes a quantum dot device, wherein the quantum dot device includes a quantum well stack, a plurality of first gates above the quantum well stack, and a plurality of second gates above the quantum well stack;
    a non-quantum processing device, coupled to the quantum processing device, to control electrical signals applied to the first and second gates; and
    a memory device to store data generated during operation of the quantum processing device;

wherein (1) the plurality of first gates are arranged in electrically continuous rows extending in a first direction and the plurality of second gates are arranged in electrically continuous rows extending in a second direction perpendicular to the first direction, or (2) the plurality of second gates are arranged as points in a two-dimensional grid and diagonal subsets of the plurality of second gates with respect to the grid are electrically continuous.

19. The quantum computing device of claim 18, further comprising:
    a cooling apparatus to maintain a temperature of the quantum processing device below 5 degrees Kelvin.

20. The quantum computing device of claim 18, wherein the memory device is to store instructions for a quantum computing algorithm to be executed by the quantum processing device.

21. A quantum dot device, comprising:
    a quantum well stack;
    a plurality of first gates above the quantum well stack; and
    a plurality of second gates above the quantum well stack; and
    insulating material between gate metal of the first gates and gate metal of the second gates such that the gate metal of the first gates is between the insulating material and the quantum well stack
    wherein a first gate of the plurality of first gates is between each nearest neighbor pair of second gates of the plurality of second gates.

22. A quantum dot device, comprising:
    a quantum well stack;
    a plurality of first gates above the quantum well stack;
    a plurality of second gates above the quantum well stack; and
    gate metal stubs alternatingly arranged with the second gates;
    wherein a first gate of the plurality of first gates is between each nearest neighbor pair of second gates of the plurality of second gates.

* * * * *